(12) United States Patent     (10) Patent No.:   US 12,567,835 B2

Horie et al.        (45) Date of Patent:     Mar. 3, 2026

---

(54) PRINTING DEVICE

(71) Applicant: BROTHER KOGYO KABUSHIKI KAISHA, Nagoya (JP)

(72) Inventors: Tsubasa Horie, Chiryu (JP); Shuhei Hiwada, Toyoake (JP)

(73) Assignee: BROTHER KOGYO KABUSHIKI KAISHA, Nagoya (JP)

( * ) Notice: Subject to any disclaimer, the term of this patent is extended or adjusted under 35 U.S.C. 154(b) by 327 days.

(21) Appl. No.: 18/339,285

(22) Filed: Jun. 22, 2023

(65) Prior Publication Data

US 2024/0007053 A1     Jan. 4, 2024

(30) Foreign Application Priority Data

Jun. 30, 2022   (JP) ................................ 2022-106544
Jun. 30, 2022   (JP) ................................ 2022-106545

(51) Int. Cl.
   *H03F 1/02*       (2006.01)
   *B41J 2/045*      (2006.01)
   *H03F 3/21*       (2006.01)

(52) U.S. Cl.
   CPC ........ *H03F 1/0205* (2013.01); *B41J 2/04541* (2013.01); *B41J 2/04586* (2013.01); *B41J 2/04588* (2013.01); *H03F 3/21* (2013.01); *H03F 2200/129* (2013.01); *H03F 2200/78* (2013.01)

(58) Field of Classification Search
   CPC .................. B41J 2/0455; B41J 2/04541; B41J 2/04543; B41J 2/04586; B41J 2/04588; H03F 1/0205; H03F 3/21; H03F 2200/129; H03F 2200/78
   See application file for complete search history.

(56) References Cited

U.S. PATENT DOCUMENTS

| | | | |
|---|---|---|---|
| 2015/0062207 A1 | 3/2015 | Abe | |
| 2016/0221333 A1 | 8/2016 | Sano | |
| 2017/0111042 A1* | 4/2017 | Yamada | ............... B41J 2/04588 |

FOREIGN PATENT DOCUMENTS

| | | |
|---|---|---|
| JP | 2012235412 A | 11/2012 |
| JP | 2013140084 A | 7/2013 |
| JP | 2015051523 A | 3/2015 |
| JP | 2016141105 A | 8/2016 |
| WO | WO-2017212868 A1 | 12/2017 |

OTHER PUBLICATIONS

Office Action issued Dec. 5, 2023 in Japanese Patent Application No. 2022-106544 (with English translation), 8 pages.

\* cited by examiner

*Primary Examiner* — Thinh H Nguyen
(74) *Attorney, Agent, or Firm* — Element IP, PLC

(57) ABSTRACT

A printing device comprises an amplifying circuit configured to amplify a drive waveform signal, and an energy generating element. The energy generating element is configured to eject the liquid from a nozzle. The amplifying circuit includes a comparator of which the drive waveform signal is input to a positive input terminal, a gate driver, an output signal being input to the gate driver from the comparator, a first N-type MOSFET and a second N-type MOSFET. A drain of the first N-type MOSFET is connected to a power supply. A source of the first N-type MOSFET is connected to a drain of the second N-type MOSFET. The printing device comprises negative feedback wiring configured to connect a negative input terminal of the comparator to the source of the first N-type MOSFET and the drain of the second N-type MOSFET.

20 Claims, 20 Drawing Sheets

<u>53</u>

DRIVING WAVEFORM A

DRIVING WAVEFORM B

DRIVING WAVEFORM C

TIME-SERIES DATA

ANALOG SIGNAL

TIME-DIVISION MULTIPLEXED SIGNAL

TIME-DIVISION MULTIPLEXED SIGNAL
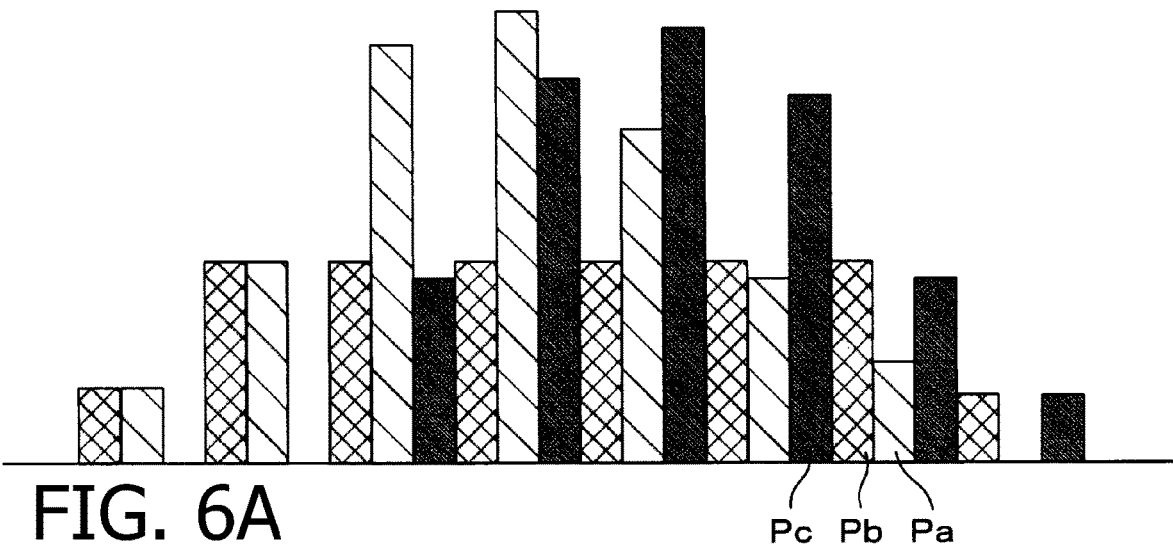
FIG. 6A
SYNCHRONIZATION SIGNAL S2a
SYNCHRONIZATION SIGNAL S2b
SYNCHRONIZATION SIGNAL S2c
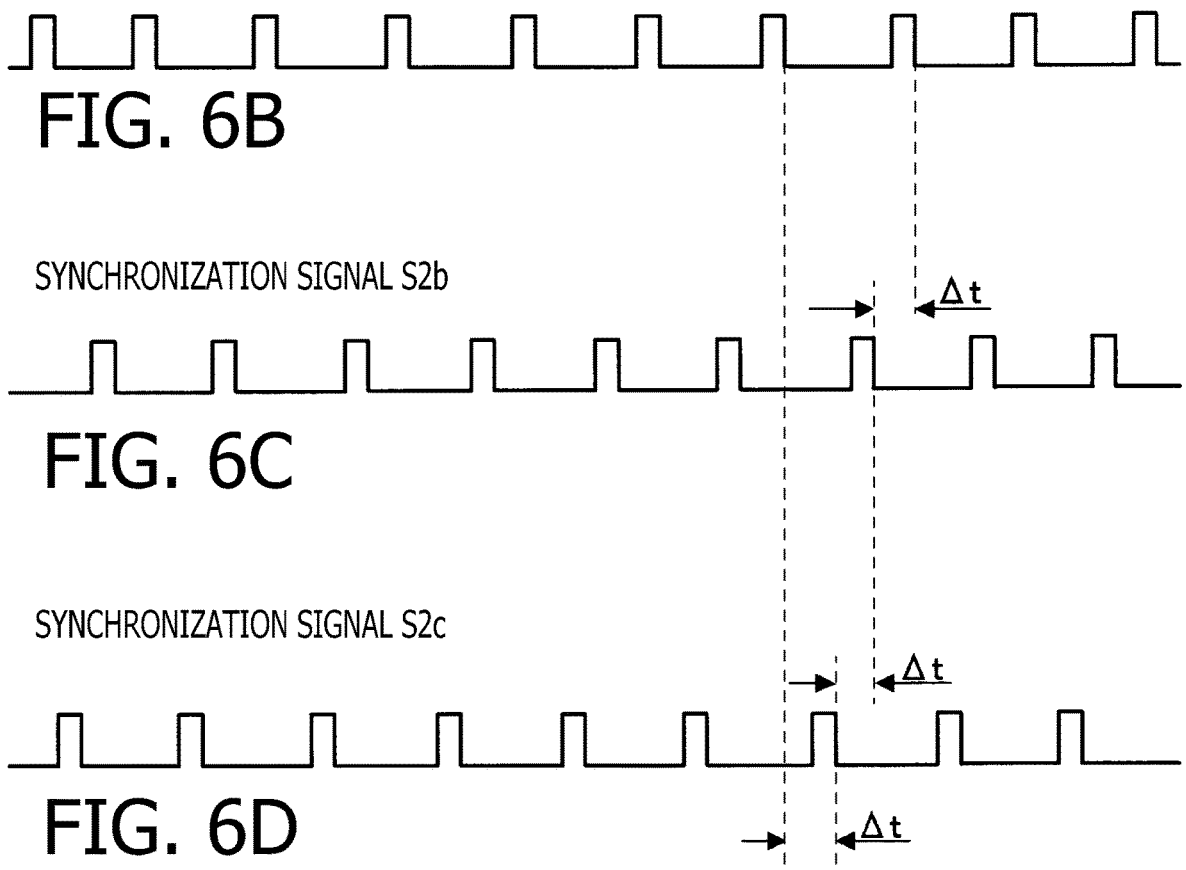
FIG. 6B
FIG. 6C
FIG. 6D

DRIVING WAVEFORM A1

DRIVING WAVEFORM B1

DRIVING WAVEFORM C1

PRINTING DEVICE

REFERENCE TO RELATED APPLICATIONS

This application claims priority from Japanese Patent Applications No. 2022-106544 and No. 2022-106545, both filed on Jun. 30, 2022. The entire content of the priority applications is incorporated herein by reference.

BACKGROUND ART

The present disclosures relate to a printing device configured to eject liquid from nozzles provided thereto.

There has been proposed a printing device that is configured to eject liquid from nozzles by driving piezoelectric elements. The piezoelectric elements are driven by a drive circuit. The drive circuit is equipped with a digital amplifier. The digital amplifier is equipped with an arithmetic circuit that outputs an error signal based on the drive waveform signal and feedback signal, and a modulation circuit that converts the error signal from the arithmetic circuit into a modulation signal by pulse modulation. The modulation circuit compares the error signal with a triangular wave. In other words, the above digital amplifier is a digital amplifier of a separately-excited type.

Since the digital amplifier amplifies the error signal in pulse waveform, a power loss can be suppressed compared to the case where the error signal is amplified in an analog waveform.

However, the separately-excited type digital amplifier requires a large number of circuits, including arithmetic and modulation circuits, and the circuit size tends to become large.

DESCRIPTION

According to aspects of the present disclosures, there is provided a printing device comprises an amplifying circuit configured to amplify a drive waveform signal, and an energy generating element configured to be driven by the drive waveform signal amplified by the amplifying circuit, the energy generating element being configured to eject the liquid from a nozzle. The amplifying circuit includes a comparator, the drive waveform signal being input to a positive input terminal of the comparator, a gate driver, an output signal being input to the gate driver from the comparator, a first N-type MOSFET configured to be driven by the gate driver, and a second N-type MOSFET configured to be driven by the gate driver. A drain of the first N-type MOSFET is connected to a power supply. A source of the first N-type MOSFET is connected to a drain of the second N-type MOSFET. The printing device further comprises negative feedback wiring configured to connect a negative input terminal of the comparator to the source of the first N-type MOSFET and the drain of the second N-type MOSFET.

FIGS. 6A, 6B, 6C and 6D illustrate a relationship among the time-division multiplexed signal and synchronizing signals.

Figure 1:
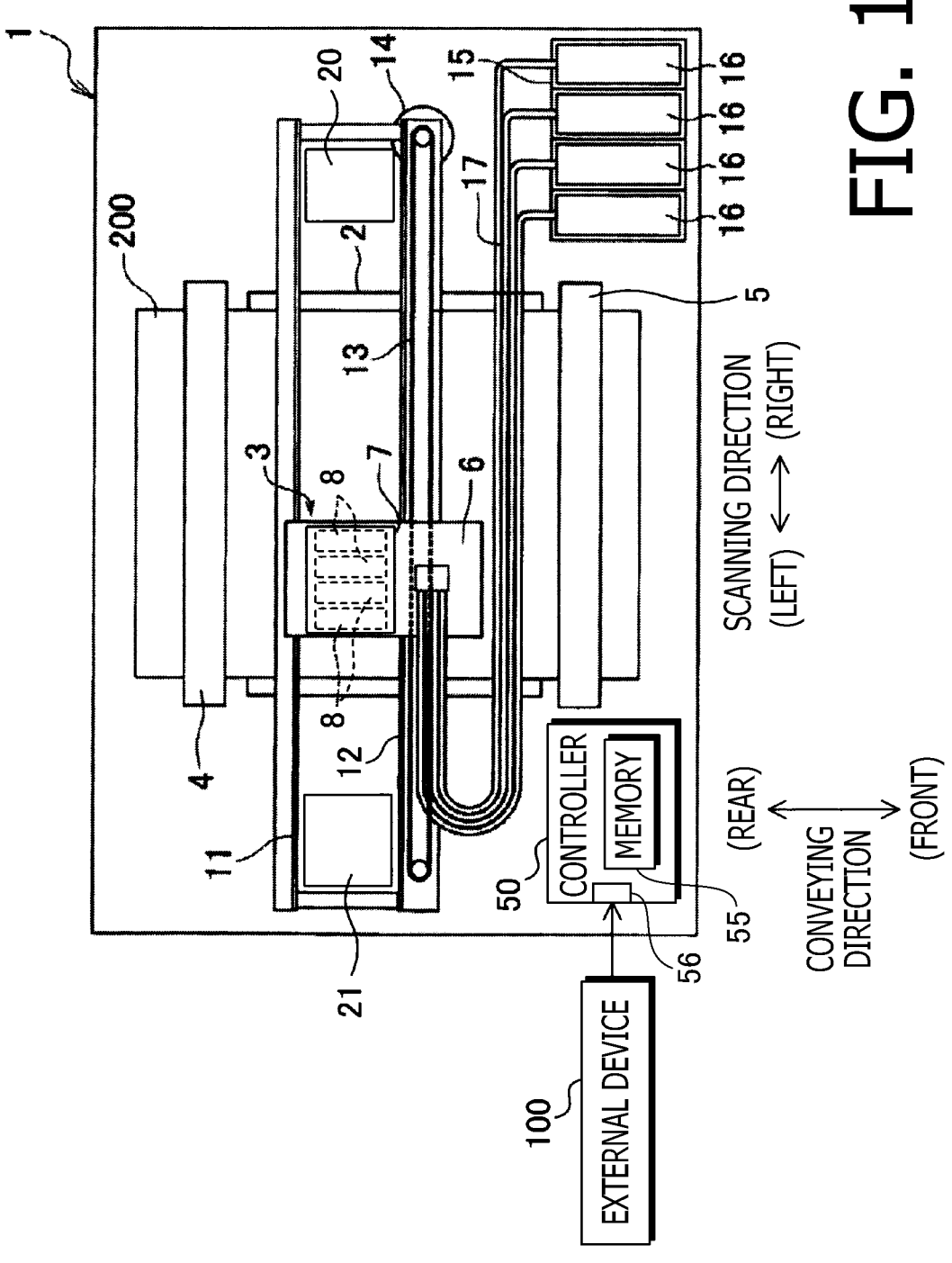
FIG. 1 is a plan view of a printing device according to an embodiment of the present disclosures.

Hereinafter, a printing device 1 according to an embodiment of the present disclosures will be described with reference to the drawings. FIG. 1 is a plan view schematically shows the printing device 1. In the following description, directions as shown in FIG. 1 will be referred to for indicating directions (i.e., front, rear, right and left directions). The front-rear direction corresponds to a sheet feed direction, and the right-left direction corresponds to a scanning direction. Further, a closer direction with respect to the plane of FIG. 1 corresponds to an upper side of the printing device 1, and a farther side with respect to the plane of FIG. 1 corresponds to a bottom side of the printing device 1.

As shown in FIG. 1, the printing device 1 has a platen 2, an ink ejection device 3, and conveying rollers 4 and 5. On an upper surface of the platen 2, printing sheet 200, which is a printing medium, is placed. The ink ejection device 3 ejects the ink (i.e., ink droplets) on the printing sheet 200 placed on the platen 2 to print an image. The ink ejection device 3 has a carriage 6, a sub tank 7, four inkjet heads 8, and a circulation pump (not show).

On the upper side of the platen 2, two guide rails 11 and 12 extending in the right-left direction are provided to guide the carriage 6. The carriage 6 is connected with an endless belt 13 that extends in the right-left direction. The endless belt 13 is driven, by the carriage driving motor 14, to move. As the endless belt 13 moves, the carriage 6 is guided by the guide rails 11 and 12, and is moved reciprocally in the scanning direction within an area facing the platen. More concretely, with supporting the four inkjet heads 8, the carriage 6 performs a first movement to move the inkjet head 8, in the scanning direction, from left to right, from a certain position to another position, and a second movement to move the inkjet head 8, in the scanning direction, from right to left, from a certain position to another position.

Between the guide rails 11 and 12, a cap 20 and flushing receiver 21 are provided. The cap 20 and the flushing receiver 21 are arranged on a lower side with respect to the ink ejection device 3. The cap 20 are arranged on a right end portion of the guide rails 11 and 12, while the flushing receiver 21 is arranged on a left end portion of the guide rails 11 and 12. It is noted that the cap 20 and flushing receiver 21 may be arranged reversely on the left and right.

The sub tank 7 and the four inkjet heads 8 are mounted on the carriage 6, and are moved, together with the carriage 6, reciprocally in the scanning direction. The sub tank 7 is connected to a cartridge holder 15 via a tube 17. To the cartridge holder 15, ink cartridges 16 of one or multiple colors (four colors, in the present embodiment) are mounted. The four colors are, for example, black, yellow, cyan, and magenta.

Inside the sub tank 7, for ink chambers are formed. In the four ink chambers, four colors of ink supplied by the four ink cartridges 16 are reserved, respectively.

The four inkjet heads 8 are arranged below the sub tank 7 in the scanning direction. On a lower surface of each inkjet head 8, multiple nozzles 80 (see FIG. 2) are formed. One inkjet head 8 corresponds to one color of ink and is connected to one ink chamber. In other words, the four inkjet heads 8 correspond to four colors of ink and are connected to the four ink chambers, respectively.

Each inkjet head 8 is provided with an ink inlet and an ink outlet. The ink inlet and the ink outlet are connected to the corresponding ink chamber via tubes. Between each ink inlet and the corresponding ink chamber, a circulation pump is interposed.

The ink sent from the ink chamber by the circulation pump flows into the inkjet heads 8 through the ink inlet and is ejected from the nozzles 80. The ink that is not ejected from the nozzles 80 returns to the inkjet head 8 through the ink inlet. The ink circulates between the ink chambers and the inkjet heads 8. The four inkjet heads 8 eject the four colors of ink toward the printing sheet 200 supplied from the sub tank 7, moving together with the carriage 6 in the scanning direction.

As shown in FIG. 1, the conveying roller 4 is arranged on an upstream side (i.e., the rear side), in the conveying direction, with respect to the platen 2. The conveying roller 5 is arranged on a downstream side (i.e., the front side), in the conveying direction, with respect to the platen 2. The two conveying rollers 4 and 5 are driven by a motor in a synchronized manner. The two conveying rollers 4 and 5 convey the printing sheet 200 placed on the platen 2 in the conveying direction that is orthogonal to the scanning direction.

The printing device 1 is provided with a controller 50. The controller 50 has a control circuit 51 (see FIG. 3) with a CPU or logic circuit (e.g., FPGA), a memory 55 such as nonvolatile memory and a RAM, and a network interface 56. The network interface 56 is configured to receive print jobs and drive waveform data from the external device 100, and the memory 55 is configured to store the received print jobs and drive waveform data. The controller 50 is configured to control driving of the ink ejection device 3 and the conveying roller 4, and the like based on the print job, thereby executing the printing process. The control circuit 51 corresponds to a controller and the network interface 56 corresponds to a receiver according to aspects of the present disclosures.

Figure 2:
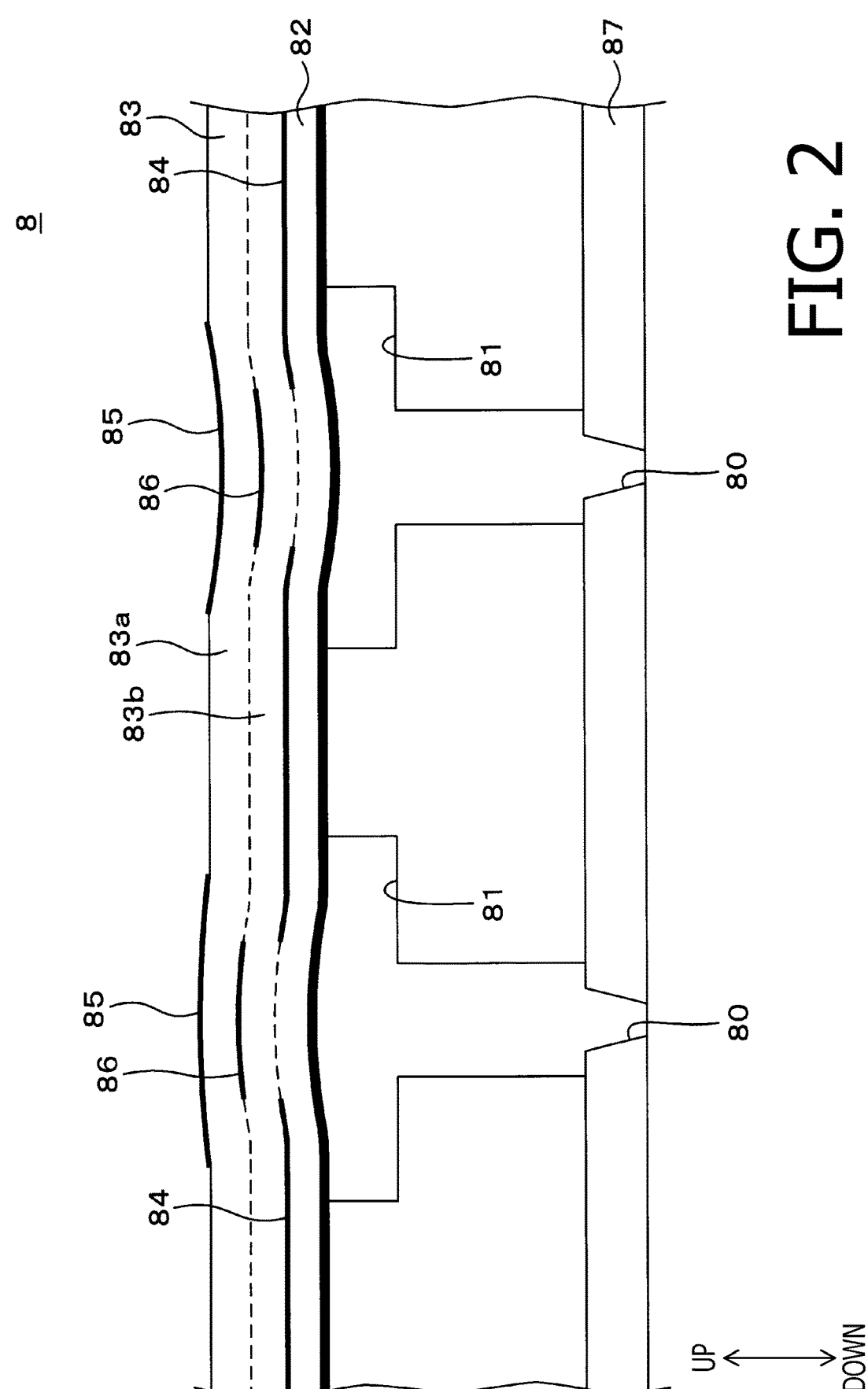
FIG. 2 is a partially enlarged cross-sectional view of an inkjet head.

FIG. 2 is a partially enlarged cross-sectional view of the inkjet head 8. The inkjet head 8 has multiple pressure chambers 81. On an upper side with respect to each pressure chamber 81, a vibrating plate 82 is formed, and a layered piezoelectric body 83 is formed on an upper side with respect to the vibrating plate 82. On the upper side with respect to each pressure chamber 81, and between the piezoelectric body 83 and the vibrating plate 82, a first common electrode 84 is formed 84. The piezoelectric body 83 is an example of an energy generating element according to aspects of the present disclosures.

Inside the piezoelectric body 83, a second common electrode 86 is provided. The second common electrode 86 is arranged on an upper side with respect to each pressure chamber 81 and on an upper side with respect to the first common electrode 84. The common electrode 86 is arranged at a position that does not face the first common electrode 84. On an upper side of each pressure chamber 81, and on an upper surface of the piezoelectric body 83, an individual electrode 85 is formed. The individual electrode 85 is arranged opposite, in the up-down direction, to the first common electrode 84 and the second common electrode 86 with the piezoelectric body 83 sandwiched therebetween. The vibrating plate 82, the piezoelectric body 83, the first common electrode 84, the individual electrode 85 and the second common electrode 86 constitute an actuator 88.

On a lower part of each pressure chamber 81, a nozzle plate 87 is provided. On the nozzle plate 87, multiple nozzles 80, each of which penetrates through the nozzle plate 87 in the up-down direction, are formed. The nozzles 80 are arranged on the bottom surface of each pressure.

The first common electrode 84 is connected to a com terminal (in the present embodiment, the ground), and the second common electrode 86 is connected to a VCOM terminal. It is noted that a VCOM voltage is higher than a COM voltage. The individual electrode 85 is connected to a switch group 54 (see FIG. 3). The individual electrode 85 is applied with a High voltage or Low voltage, thereby the piezoelectric body 83 deforming to vibrate the vibrating plate 82. As the vibrating plate 82 vibrates, the ink is ejected from the pressure chamber 81 through the nozzles 80.

The individual electrode 85 corresponds to a first electrode, the second common electrode 86 corresponds to a second electrode, and the first common electrode 84 corresponds to a third electrode. Further, a first portion 83a between the individual electrode 85 and the second common electrode 86 in the piezoelectric body 83 corresponds to a first piezoelectric layer, and a second portion 83b between the second common electrode 86 and the first common electrode 84 in the piezoelectric body 83 corresponds to a second piezoelectric layer. The vibrating plate 82 corresponds to a third piezoelectric layer. That is, the actuator 88 has a three-layer structure.

Figure 3:
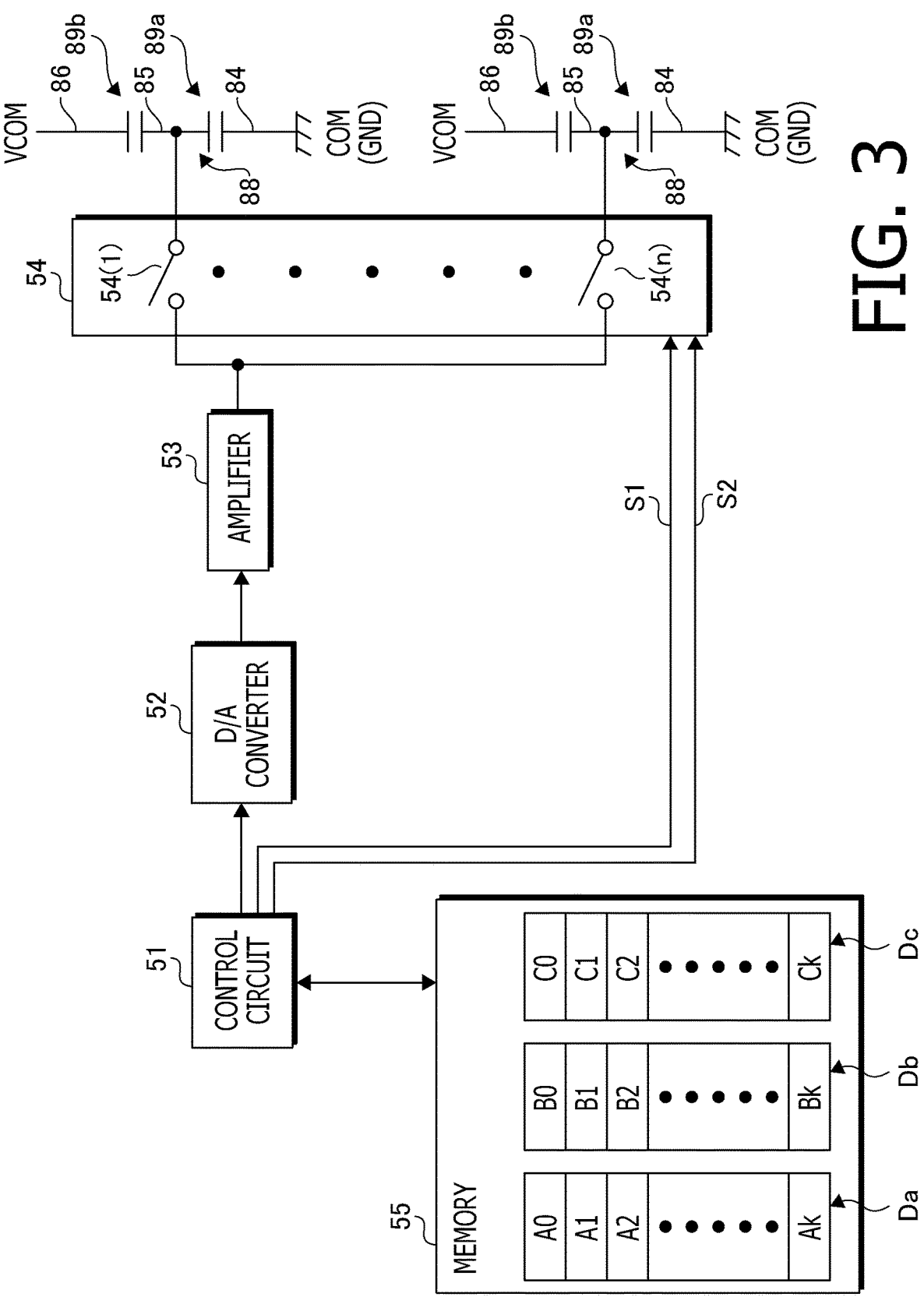
FIG. 3 is a block diagram of a controller of the printing device.

FIG. 3 is a block diagram of the controller 50. The controller 50 includes a control circuit 51, a D/A converter 52, an amplifier 53, a switch group 54 and a memory 55. The memory stores the drive waveform data. The drive waveform data is quantized data indicating a voltage waveform applied to the individual electrode 85, that is, data indicating the drive waveform to drive the actuator 88. In the present embodiment, drive waveform data Da, Db and Dc are stored in the memory 55.

The D/A converter 52 is configured to convert a digital signal to an analog signal. The amplifier 53 is an amplifying circuit configured to amplify the analog signal. The switch group 54 includes multiple n-th switches 54(n), (n=1, 2, . . . ). The n-th switch 54(n) is configured by, for example, an analog switch IC. One ends of the multiple n-th switches 54(n) are connected to the amplifier 53 through a common bus. The other ends of the multiple n-th switches 54(n) are connected to respective individual electrodes 85 corresponding to the multiple nozzles 80, respectively.

The individual electrode 85, the first common electrode 84 and the piezoelectric body 83 constitute a first condenser 89a. Further, the individual electrode 85, the second common electrode 86 and the piezoelectric body 83 constitute a second condenser 89b.

Figures 4A, 4B, 4C:
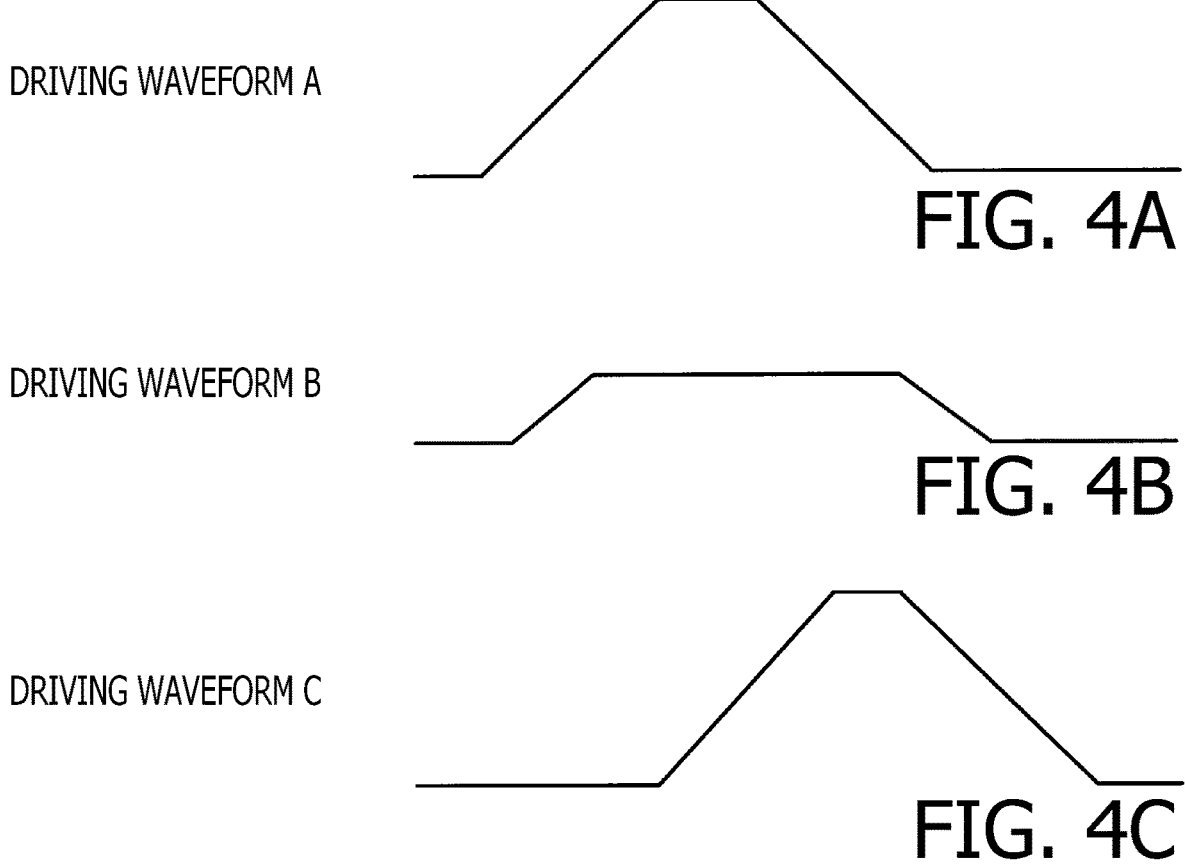
FIGS. 4A, 4B and 4C show examples of drive waveform.

FIGS. 4A-4C show an example of drive waveforms A, B and C, respectively. The drive waveforms A, B and C deforms the piezoelectric body 83. As the piezoelectric body 83 is deformed, the vibrating plate 82 vibrates. Then, by the vibration of the vibrating plate 82, the ink in the pressure chamber 81 is caused to pass through a descender, and ejected through the nozzle 80. For example, the drive waveform A is for ejecting a large-size droplet, and the drive waveform B is for ejecting a medium-size droplet. The drive waveform C is also for ejecting a large-sized droplet, but the drive waveforms A and C have different ejection timings.

In each of FIG. 4A-4C, a right-hand side portion of the waveform represents a state earlier in time than a left-hand side portion. The same applies to FIGS. 5A-5C, 6A-6D, and 7A-7C. The waveform data Da is the quantized data of the drive waveform A, the waveform data Db is the quantized data of the drive waveform B, and the waveform data Dc is the quantized data of the drive waveform C. The drive waveform data Da includes quantized data Ak (k=0, 1, 2, . . . ), the drive waveform data Db includes quantized data Bk (k=0, 1, 2, . . . ) and the drive waveform data Dc includes quantized waveform data Ck (k=0, 1, 2, . . . ).

Figures 5A, 5B, 5C:
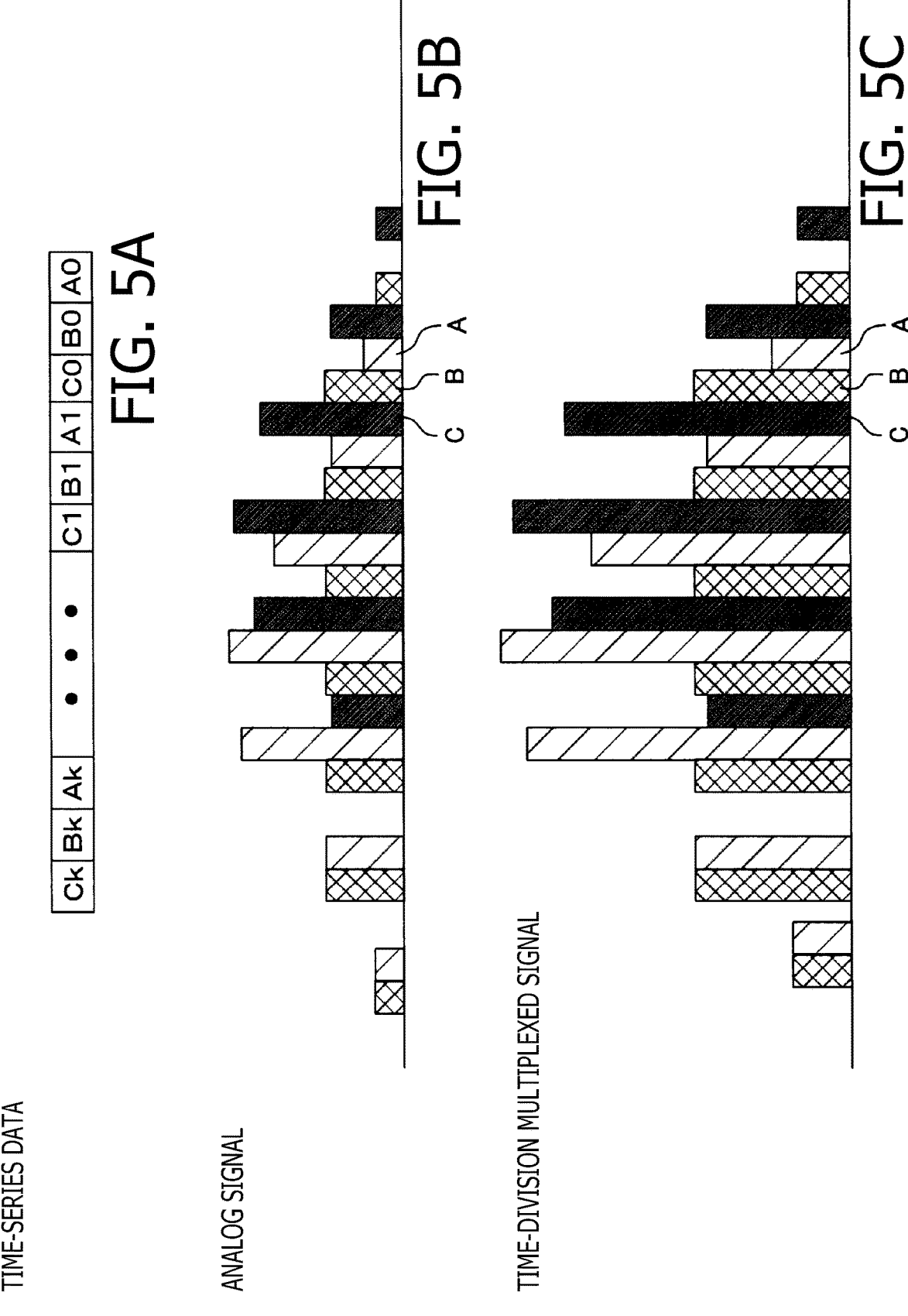
FIGS. 5A, 5B and 5C illustrate a data configuration of time-series data, an analog signal and a time-division multiplexed signal, respectively.

FIGS. 5A-5C show an example of time-series data, an analog signal and a time-division multiplexed signal. In FIGS. 5B and 5C, portions indicated by "A," "B," and "C" corresponds to the drive waveforms A, B and C, respectively. When driving the actuator 88, the control circuit 51 access the memory 55 to obtain the drive waveform data Da, Db and DC, and generates time-series data. The time-series data is data composed of data Ak, Bk, and Ck, arranged in order (i.e., A0, B0, C0, A1, B1, C1, . . . , Ak, Bk, Ck) with a time interval Δt. The time-series data is a digital signal. The time interval Δt is an inverse of a particular sampling frequency. The quantized data Ak, Bk, and Ck are arranged in the order A0, B0, C0, A1, B1, C1, . . . , Ak, Bk, Ck, at intervals of time corresponding to the inverse of the particular sampling frequency. In other words, the data length of the quantized data Ak, Bk, and Ck is less than or equal to the length corresponding to the inverse of the particular sampling frequency.

The quantized data A0 is continuous with the quantized data B0, the quantized data B0 is continuous with the quantized data C0, and the quantized data C0 is continuous with the quantized data A1. Therefore, there is no quantized data C0, other quantized data or other waveform data between the quantized data A0 and the quantized data B0.

Further, there is no quantized data A0, other quantized data or other waveform data between the quantized data B0 and the quantized data C0. Furthermore, there is no quantized data B0, other quantized data or other waveform data between the quantized data C0 and the quantized data A1. It is noted that the sampling frequency is 24 MHz, and the data length of the quantized data Ak, Bk, and Ck is about 41 ns.

The control circuit 51 outputs the time-series data to the D/A converter 52. As shown in FIG. 5B, the D/A converter 52 converts the time-series data to an analog signal and outputs the same to the amplifier 53. The amplifier 53 amplifies the input analog signal, and outputs the amplified signal to the switch group 54. As shown in FIG. 5C, the analog signal amplified by the amplifier 53 constitutes the time-division multiplexed signal.

For example, in FIGS. 5A-5C, there is only one time-division multiplexed signal. In FIGS. 5A-5C, the analog signal corresponding to data C0 appears to be isolated. However, it is because an analog signal corresponding to a group of three pieces of data including data A0, data B0 and data C0, with data A0 and data B0 being zero, is consecutive in time series to an analog signal corresponding to a group of three pieces of data including data A1, data B1 and data C1, with data A1 being zero. Further, an analog signal corresponding to a group of data Ak and data Bk appears to be isolated. However, it is because an analog signal corresponding to a group of three pieces of data including data A(k−1), data B(k−1) and data C(k−1), with data C(k−1) being zero, is consecutive in time series to an analog signal corresponding to a group of three pieces of data including data Ak, data Bk and data Ck. For the same reason, an analog signal corresponding to a group of data A(k−1) and data B(k−1) appears to be isolated. Therefore, the analog signal shown in FIG. 5B is treated as one time-division multiplexed signal.

In the time-division multiplexed signal, there is no first part, fourth part and other waveforms between the third part and the second part. Furthermore, in the time-division multiplexed signal, there is no first part, third part, or other waveforms between the second and fourth parts. There are similar relationships are between data Ak and Ck, and there are similar relationships between data Bk and Ck. One time-division multiplexed signal is contained within one ejection drive period. For example, when the ejection drive frequency (ejection frequency) is 100 kHz, one ejection drive period (ejection period) is 10 μs, and one time-division multiplexed signal is less than 10 μs in length. It is preferable that there are at least three pieces of data Ak, three pieces of data Bk and three pieces of data Ck in a single time-division multiplexed signal. The reason will be described later.

The control circuit 51 outputs, to a switch group 54, a switch control signal S1, which controls the opening and closing of the multiple n-th switches 54(n), a synchronization signal S2a corresponding to a drive waveform A, a synchronization signal S2b corresponding to a drive waveform B, and a synchronization signal S2c corresponding to a drive waveform C. The three synchronization signals S2a, S2b, and S2c may also be referred to simply as synchronization signals S2 (see FIG. 3). The switch control signal S1 includes first selection information indicating selection of one of the multiple n-th switches 54(n) and second selection information indicating selection of one of the three synchronization signals S2a, S2b and S2c. The first and second selection information are associated with each other.

A synchronization signal generation circuit that generates three synchronization signals S2a, S2b, and S2c may be provided in the controller 50, and when a trigger signal is received from the control circuit 51, the three synchronization signals S2a, S2b, and S2c may be output from the synchronization signal generation circuit to the switch group 54. Alternatively, the switch group 54 may generate the synchronization signals S2a, S2b, and S2c. Further alternatively, when receiving a trigger signal from the control circuit 51, the switch group 54 may generate the synchronization signals S2a, S2b and S2c.

FIGS. 6A-6D illustrate a relationship between the time-division multiplexed signal and the synchronization signals S2a, S2b and S2c. The synchronization signals S2a, S2b and S2c are pulse waves. A time interval Δt is provided between the rising edge of the pulse of the synchronizing signal S2a and the rising edge of the pulse of the synchronizing signal S2b. Furthermore, a time interval Δt is provided between the rising edge of the pulse of synchronous signal S2b and the rising edge of the pulse of synchronous signal. As mentioned above, the data Ak, Bk and Ck constituting the time-series data are arranged in sequence with the time interval Δt.

Therefore, when the control circuit 51 accesses the time-division multiplexed signal at the rising edge of the pulse of the synchronizing signal S2a, the control circuit 51 can obtain the drive waveform signal Pa, which corresponds to data Ak and indicates drive waveform A. When the control circuit 51 accesses the time-division multiplexed signal at the rising edge of the pulse of the synchronizing signal S2b, the control circuit 51 can obtain the drive waveform signal Pb, which corresponds to data Bk and indicates drive waveform B. When the control circuit 51 accesses the time-division multiplexed signal at the rising edge of the pulse of the synchronizing signal S2c, the control circuit 51 can obtain the drive waveform signal Pc, which corresponds to data Ck and indicates drive waveform C. In other words, one type of time-division multiplexed signal is input to one n-th switch 54(n), thereby one of the drive waveform signal Pa representing a drive waveform A, the drive waveform signal Pb representing a drive waveform B, and the drive waveform signal Pc representing a drive waveform C is separated.

The switch group 54 opens and closes the selected n-th switch at the opening/closing timings indicated by the selected one of the synchronizing signals S2a-S2c. In other words, the switch group 54 opens/closes the n-th switch 54(n) in accordance with a particular sampling frequency.

Figures 7A, 7B, 7C:
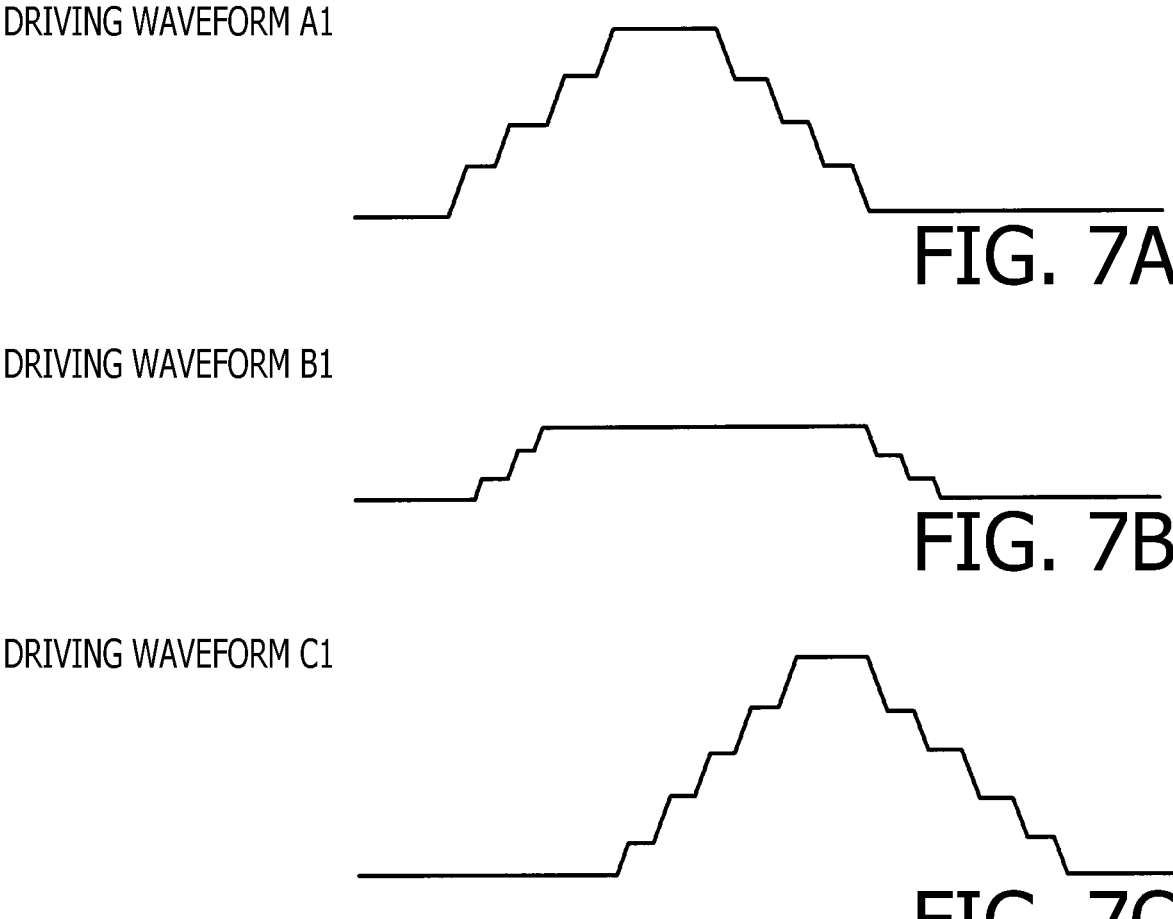
FIGS. 7A, 7B and 7C show examples of the drive waveform input to an actuator in accordance with opening/closing of an n-th switch.

FIGS. 7A-7C show the drive waveforms input to the actuator 88 in accordance with the opening/closing of the n-th switch 54(n). When the synchronizing signal S2a is selected, the switch group 54 closes the n-th switch 54(n) during a period where the pulse of the synchronizing signal S2a is in the high-level state, and opens the n-th switch 54(n) during a period where the pulse of the synchronizing signal S2a is in the low-level state. Electrical charge applied to the individual electrode 85 when the n-th switch 54(n) is closed is held by the first condenser 89a and the second condenser 89b, and the drive waveform A1 is input to the actuator 88 as shown in FIG. 7A. In other words, in accordance with the particular sampling frequency, the drive waveform signal Pa is separated from the time-division multiplexed signal, and the actuator 88 is driven by the drive waveform signal Pa. It is noted that, in order to represent a change (i.e., concavity and convexity) of the drive waveform signal Pa, three or more pieces of data Ak is required.

When the synchronizing signal S2b is selected, the switch group 54 closes the n-th switch 54(n) during a period where the pulse of the synchronizing signal S2b is in the high-level state, and opens the n-th switch 54(n) during a period where the pulse of the synchronizing signal S2b is in the low-level state. Electrical charge applied to the individual electrode 85 when the n-th switch 54(n) is closed is held by the first condenser 89a and the second condenser 89b, and the drive waveform B1 is input to the actuator 88 as shown in FIG. 7B. In other words, in accordance with the particular sampling frequency, the drive waveform signal Pb is separated from the time-division multiplexed signal, and the actuator 88 is driven by the drive waveform signal Pb. It is noted that, in order to represent a change (i.e., concavity and convexity) of the drive waveform signal Pb, three or more pieces of data Bk is required.

When the synchronizing signal S2c is selected, the switch group 54 closes the n-th switch 54(n) during a period where the pulse of the synchronizing signal S2c is in the high-level state, and opens the n-th switch 54(n) during a period where the pulse of the synchronizing signal S2c is in the low-level state. Electrical charge applied to the individual electrode 85 when the n-th switch 54(n) is closed is held by the first condenser 89a and the second condenser 89b, and the drive waveform C1 is input to the actuator 88 as shown in FIG. 7C. In other words, in accordance with the particular sampling frequency, the drive waveform signal Pc is separated from the time-division multiplexed signal, and the actuator 88 is driven by the drive waveform signal Pc. It is noted that, in order to represent a change (i.e., concavity and convexity) of the drive waveform signal Pc, three or more pieces of data Ck is required.

The particular sampling frequency is higher than a resonance frequency of the inkjet head 8. The resonance frequency of the inkjet head 8 is a resonance frequency when the pressure chamber 81 is not filled with liquid (ink), or a resonance frequency when the pressure chamber 81 is filled with the liquid (ink). When, for example, the resonance frequency when the pressure chamber 81 is not filled with the ink is 100 kHz, the resonance frequency when the pressure chamber 81 is filled with the ink is less than 100 kHz. Concretely, for example, the resonance frequency when the pressure chamber 81 is filled with the ink is 90 kHz. In other words, the resonance frequency of the inkjet head 8 when the pressure chamber 81 is not filled with the ink is greater than the same when the pressure chamber 81 is filled with the ink.

Figure 8:
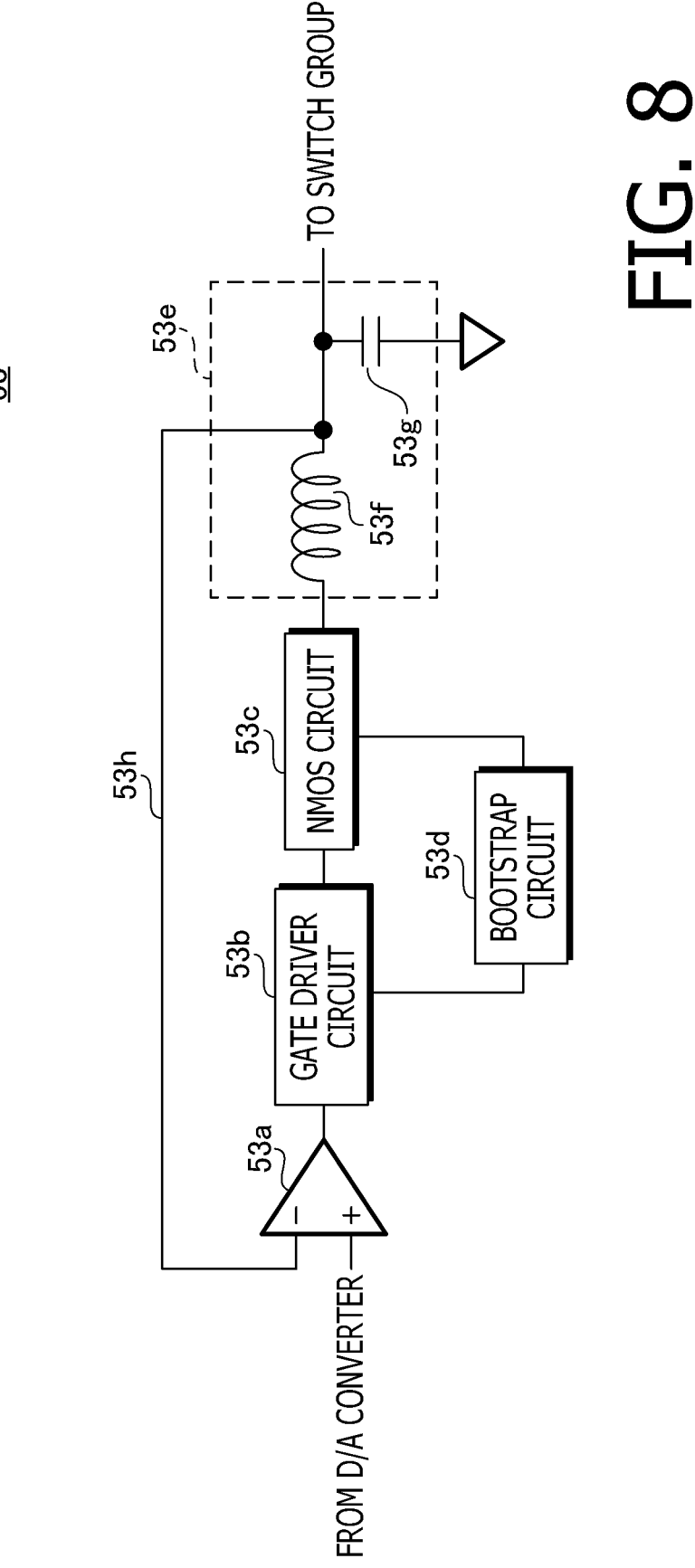
FIG. 8 is a circuit diagram schematically showing a configuration of the amplifier.

FIG. 8 schematically shows a circuit diagram of the amplifier 53. The amplifier 53 is a self-excited digital amplifier. The amplifier 53 has a comparator 53a, a gate driver circuit 53b, an NMOS circuit 53c, a bootstrap circuit 53d, a low-pass filter 53e, and negative feedback wiring 53h.

A positive input terminal of the comparator 53a is connected to the D/A converter 52, and an analog signal transmitted from the D/A converter 52 is input to the positive input terminal of the comparator 53a. The output terminal of the comparator 53a is connected to the gate driver circuit 53b, and the output signal of the comparator 53a is input to the gate driver circuit 53b. The gate driver circuit 53b is connected to the NMOS circuit 53c and outputs an ON or OFF signal to the NMOS circuit 53c based on the output signal transmitted from the comparator 53a. The NMOS circuit 53c is driven by the ON or OFF signal transmitted from the gate driver circuit 53b and outputs a signal to the low-pass filter (LPF) 53e.

The low-pass filter 53e has an inductor 53f and a capacitor 53g. One end of the inductor 53f is connected to the NMOS circuit 53c, and the other end is connected to one end of the capacitor 53g. The other end of capacitor 53g is connected to the ground. The other end of the inductor 53f and one end of the capacitor 53g are connected to the switch group 54(n). In other words, the low-pass filter 53e outputs the time-division multiplexed signal generated by amplifying the signal, i.e., the analog signal, to the switch group 54(*n*). One end of the negative feedback wiring 53*h* is connected to the other end of the inductor 53*f* and one end of the capacitor 53*g*, and the other end of the negative feedback wiring 53*h* is connected to the negative input terminal of the comparator 53*a*. The bootstrap circuit 53*d* is connected to the gate driver circuit 53*b* and the NMOS circuit 53*c*.

Figure 9:
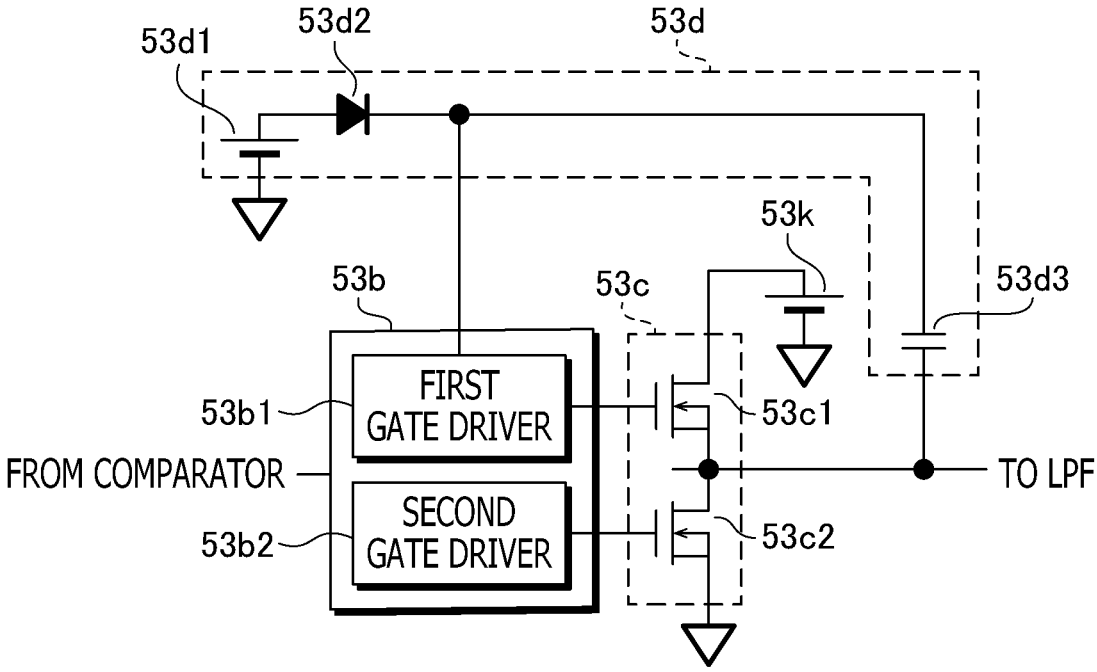
FIG. 9 is a circuit diagram schematically showing configurations of a gate driver circuit, an NMOS circuit and a bootstrap circuit.

FIG. 9 schematically shows a circuit diagram of the gate driver circuit 53*b*, the NMOS circuit 53*c*, and the bootstrap circuit 53*d*. The gate driver circuit 53*b* has a first gate driver 53*b*1 and a second gate driver 53*b*2. The NMOS circuit 53*c* has a first N-type MOSFET 53*c*1 and a second N-type MOSFET 53*c*2. The first gate driver 53*b*1 is connected to a gate of the first N-type MOSFET 53*c*1. The second gate driver 53*b*2 is connected to a gate of the second N-type MOSFET 53*c*2. A drain of the first N-type MOSFET 53*c*1 is connected to the first power supply 53*k*. A source of the first N-type MOSFET 53*c*1 is connected to the drain of the second N-type MOSFET 53*c*2. A source of the second N-type MOSFET 53*c*2 is connected to the ground. The source of the first N-type MOSFET 53*c*1 and the drain of the second N-type MOSFET 53*c*2 are connected to one end of the low-pass filter (LPF) 53*e*, i.e., the inductor 53*f* In other words, the negative feedback wiring 53*h* is connected to the source of the first N-type MOSFET 53*c*1 and the drain of the second N-type MOSFET 53*c*2 via the low-pass filter 53*e*.

The bootstrap circuit 53*d* has a second power supply 53*d*1, a diode 53*d*2, and a bootstrap capacitor 53*d*3. A negative terminal of the second power supply 53*d*1 is connected to the ground, and a positive terminal of the second power supply 53*d*1 is connected to an anode of the diode 53*d*2. A cathode of the diode 53*d*2 is connected to one end of the bootstrap capacitor 53*d*3. The other end of the bootstrap capacitor 53*d*3 is connected to the source of the first N-type MOSFET 53*c*1 and the drain of the second N-type MOSFET 53*c*2. Further, the cathode of the diode 53*d*2 and one end of the bootstrap capacitor 53*d*3 are connected to the first gate driver 53*b*1.

When the voltage input to the positive input terminal of comparator 53*a* is lower than the voltage input to the negative input terminal, the comparator 53*a* outputs a Low signal to the gate driver circuit 53*b*. When a Low signal is input to gate driver circuit 53*b*, the second gate driver 53*b*2 outputs an ON signal to the gate of the second N-type MOSFET 53*c*2 and the first gate driver 53*b*1 does not output an ON signal to the gate of the first N-type MOSFET 53*c*1. That is, the second N-type MOSFET 53*c*2 conducts, while the first N-type MOSFET 53*c*1 does not. Therefore, the other end of the bootstrap capacitor 53*d*3 is connected to the ground, and the bootstrap capacitor 53*d*3 is charged by the second power supply 53*d*1. In other words, the bootstrap capacitor 53*d*3 is charged by the conduction of the second N-type MOSFET 53*c*2.

When the voltage input to the positive input terminal of the comparator 53*a* becomes higher than the voltage input to the negative input terminal thereof after the completion of charging the bootstrap capacitor 53*d*3, the comparator 53*a* outputs a High signal to the gate driver circuit 53*b*. When the High signal is input to the gate driver circuit 53*b*, the first gate driver 53*b*1 outputs an ON signal to the gate of the first N-type MOSFET 53*c*1, and the second gate driver 53*b*2 does not output an ON signal to the gate of the second N-type MOSFET 53*c*2. That is, the first N-type MOSFET 53*c*1 becomes conductive while the second N-type MOS-FET 53*c*2 does not.

When the voltage at the source of the first N-type MOS-FET 53*c*1 when the second N-type MOSFET 53*c*2 is not conductive is represented by VS, and the voltage applied to both ends of the charged bootstrap capacitor 53*d*3 is represented by VC, the voltage at one end of the bootstrap capacitor 53*d*3 is VS+VC. Therefore, the first gate driver 53*b*1 can output to the gate of the first N-type MOSFET 53*c*1 a signal of a voltage higher than the voltage VS of the source of the first N-type MOSFET 53*c*1, that is, an ON signal. That is, the first gate driver 53*b*1 causes the first N-type MOSFET 53*c*1 to be conductive by the voltage after the charging of the bootstrap capacitor 53*d*3. In other words, the first N-type MOSFET 53*c*1 cannot be made to be conductive until after the bootstrap capacitor 53*d*3 has been charged. As the first N-type MOSFET 53*c*1 is conductive, a signal based on the voltage of the first power supply 53*k* is output to the low-pass filter 53*e*.

When a print job is received by the network interface 56, in other words, when a print job is received via the network interface 56 and the print job is stored in the memory 55, the control circuit 51 makes the second N-type MOSFET 53*c*2 be conductive and the bootstrap capacitor 53*d*3 charged. That is, the control circuit 51 can cause the bootstrap capacitor 53D3 to be charged before printing begins.

In the printing device 1 according to the first embodiment, the amplifier 53 (amplifying circuit) is a self-excited digital amplifier, and its configuration is simpler than that of the other-excited digital amplifiers. Therefore, upsizing of the amplifier circuit can be suppressed.

Figure 10:
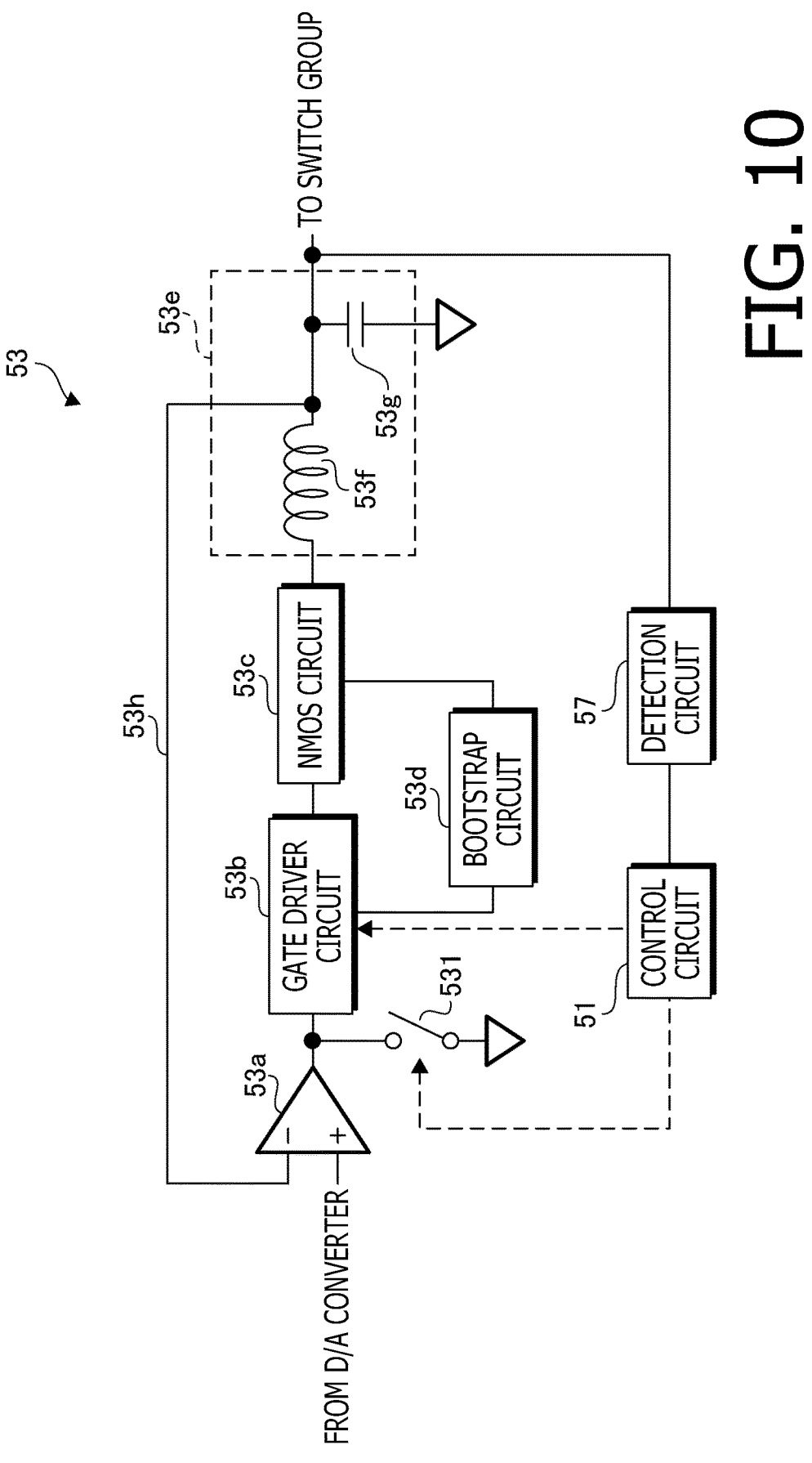
FIG. 10 is a circuit diagram schematically showing an amplifier of the printing device, a control circuit and a detection circuit.

Hereinafter, the printing device 1 according to a first modified embodiment will be describe with reference to the drawings. FIG. 10 is a circuit diagram schematically showing a configuration of the amplifier 53, the control circuit 51, and the detection circuit 57. Among the configurations of the first modification, elements similar to those of the above-described embodiment are assigned with the same symbols, and the detailed description thereof is omitted.

In the first modification, the gate driver circuit 53*b* has an enable function. When the enable function of the gate driver circuit 53*b* is turned on, that is, when the gate driver circuit 53*b* is in an effective state in which the gate driver circuit 53*b* performs outputting according to the output of the comparator 53*a*, the first gate driver 53*b*1 can turn on or off the first N-type MOSFET 53*c*1 according to the output of the comparator 53*a*, and the second gate driver 53*b*2 can turn on or off the second N-type MOSFET 53*c*2.

When the enable function of gate driver circuit 53*b* is turned off, that is, when the gate driver circuit 53*b* is in an ineffective state in which the gate driver circuit 53*b* does not perform outputting according to the output of the comparator 53*a*, the first gate driver 53*b*1 forcibly turns off the first N-type MOSFET 53*c*1 and the second gate driver 53*b*2 forcibly turns off the second N-type MOSFET 53*c*2. The control circuit 51 is configured to turn on or off the enable function of the gate driver circuit 53*b*. That is, the gate driver circuit 53*b* can be switched between the effective and ineffective states, and the control circuit 51 can set the gate driver circuit 53*b* to the effective or ineffective state.

Unlike the above-described embodiment, the first modification has a switch 531 and a detection circuit 57. The switch 531 is configured to connect the output terminal of the comparator 53*a* to ground or to disconnect the connection therebetween. The control circuit 51 controls the opening and closing of the switch 531.

The detection circuit 57 detects the output voltage of the amplifier 53 and outputs information regarding the detected voltage to the control circuit 51. The detection circuit 57 corresponds to a voltage detector according to aspects of the present disclosures. When the detection circuit 57 detects a first voltage with respect to 0 volts, the control circuit 51 closes switch 531. That is, the control circuit 51 connects the output terminal of comparator 53a to the ground. The first voltage is a voltage within a particular range with reference to 0 volts, e.g., 0 to 0.5V.

When the detection circuit 57 detects a second voltage with respect to a voltage other than 0 volts, the control circuit 51 turns off the enable function of the gate driver circuit 53b. That is, the control circuit 51 sets the gate driver circuit 53b to the ineffective state. The second voltage is an approximately constant voltage that should be output by the amplifier 53 for a particular period of time, for example, a voltage within a particular range with respect to the maximum voltage value Vs that is input to the positive input terminal of the comparator 53a for a particular period of time. For example, the voltage is within a range of Vs–0.5 to Vs+0.5V. The maximum value Vs is stored in memory 55 in advance. The second voltage is not limited to a voltage within a particular range with respect to the maximum voltage value Vs, but may be a voltage within a particular range with respect to a voltage other than 0 volts. The above process of closing switch 531 and turning off the enable function of the gate driver circuit 53b is hereinafter referred to as a first process.

Figure 11:
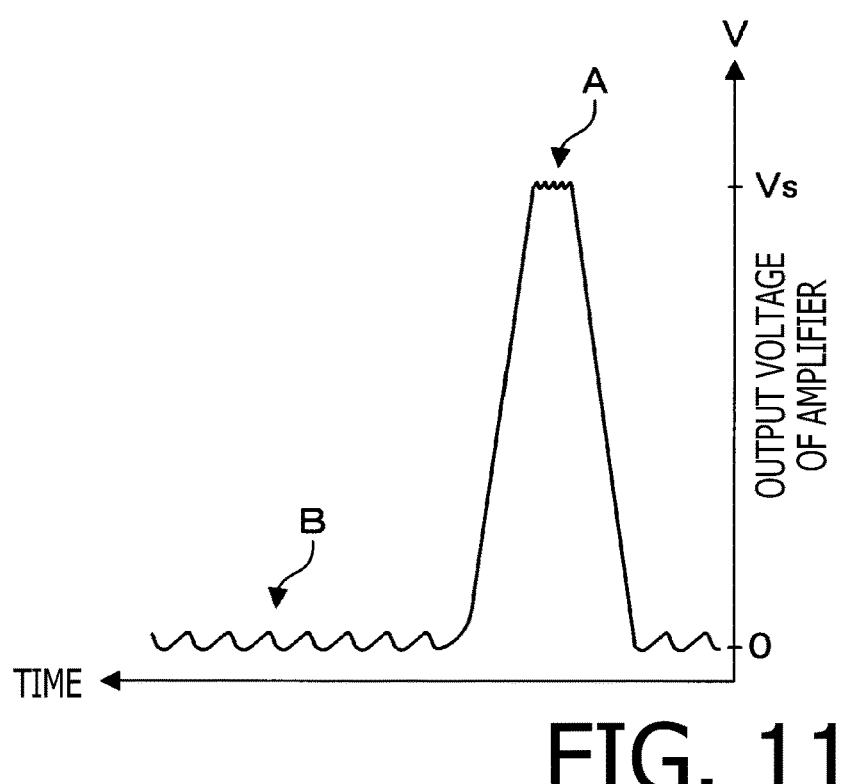
FIG. 11 is a graph showing an output voltage of the amplifier when a first process is not performed.
Figure 12:
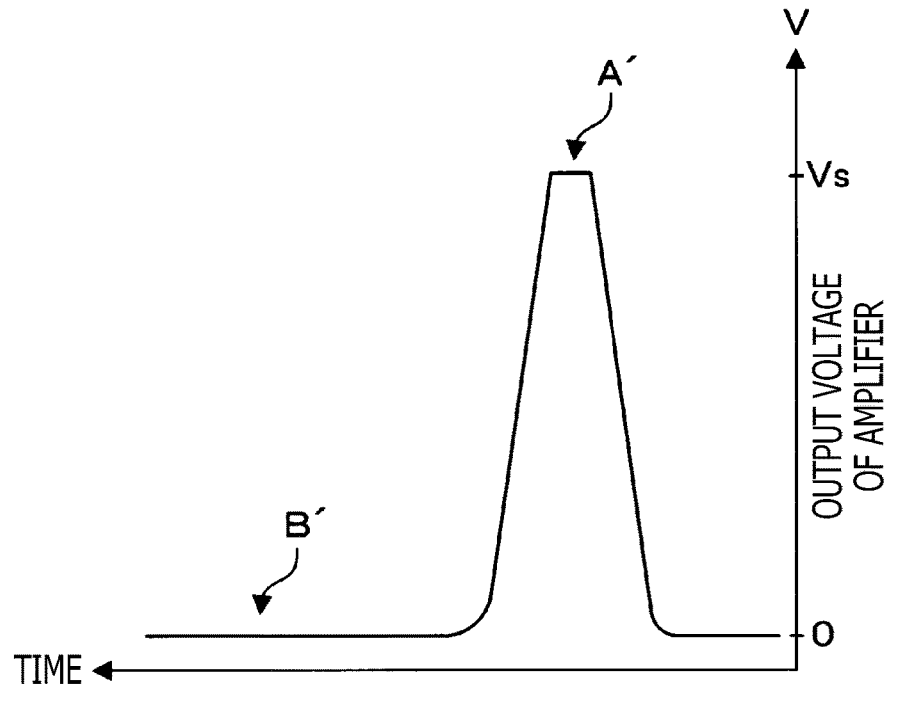
FIG. 12 is a graph showing an output voltage of the amplifier when the first process is performed.
Figure 14:
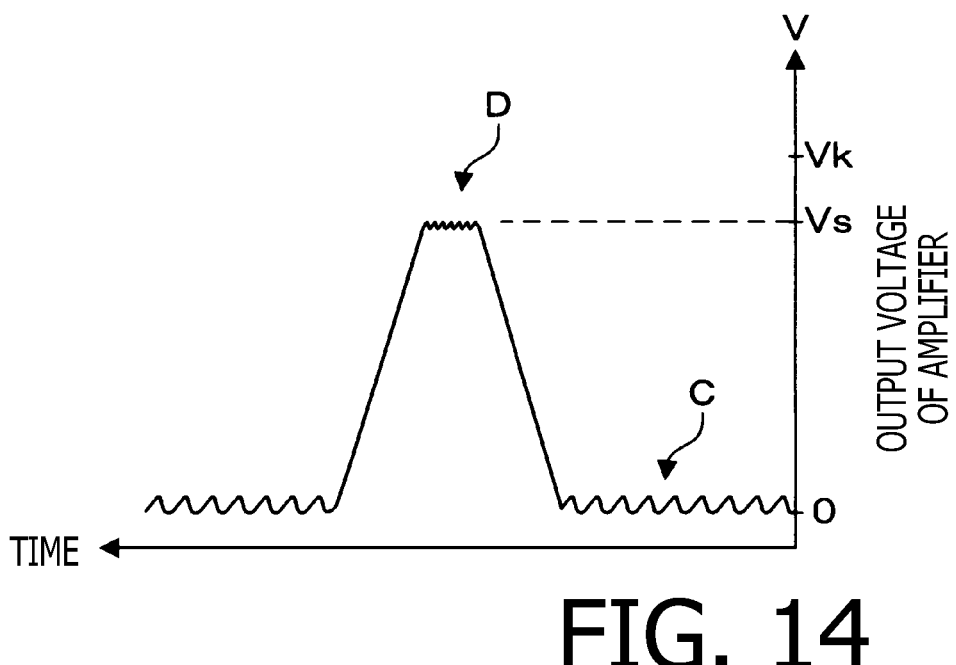
FIG. 14 is a graph showing an output voltage of the amplifier when the second and third processes are not performed.
Figure 15:
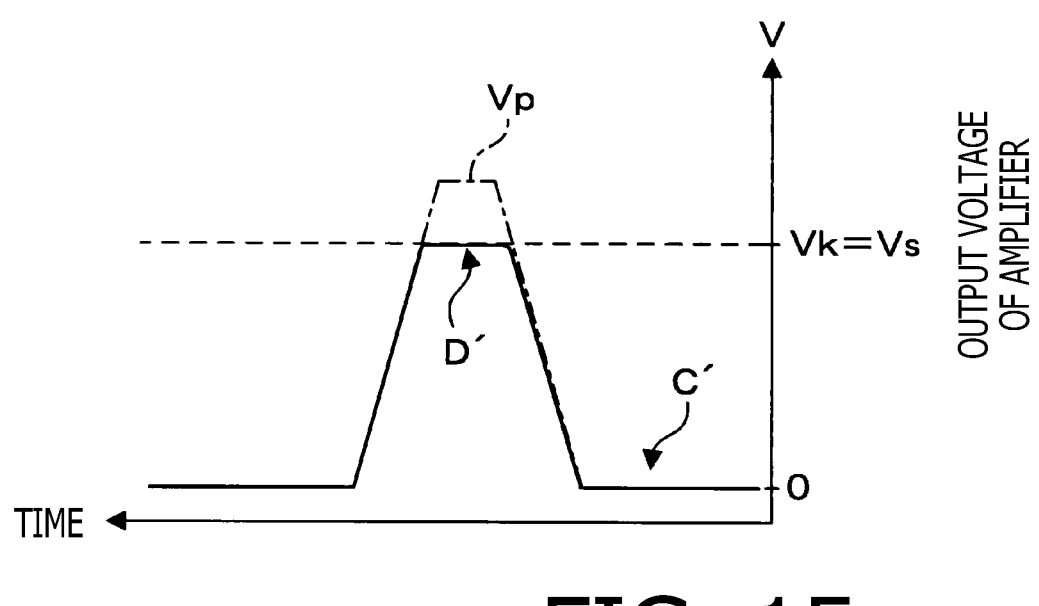
FIG. 15 is a graph showing an output voltage of the amplifier when the second and third processes are performed.

FIG. 11 shows the output voltage of the amplifier 53 when the first process is not performed. The horizontal axis in FIG. 11 shows time, with the right-hand side showing the past and the left-hand side showing the future. FIG. 12, FIG. 14, and FIG. 15 are configured in the same manner. When the first process is not executed, the control circuit 51 keeps switch 531 open always so that the enable function of the gate driver circuit 53b is always on. In other words, a state where the first process cannot be executed is the same as a state where the amplifier 53 does not have the switch 531 and the gate driver circuit 53b does not have the enable function.

As indicated by a letter "A" in FIG. 11, the output waveform of the amplifier 53 pulsates and ripples in the vicinity of Vs. As indicated by a letter "B" in FIG. 11, the output waveform of the amplifier 53 pulsates in waves near 0 volts. That is, when the amplifier 53 should output an approximately constant voltage, the output waveform of the amplifier 53 pulsates. This is due to the following reasons.

An approximately constant voltage is input to the positive input terminal of the amplifier 53. When the voltage input to the minus input terminal of the comparator 53a is higher than the voltage input to the plus input terminal, the comparator 53a outputs a Low signal. The second N-type MOSFET 53c2 is turned on, the first N-type MOSFET 53c1 is turned off, and the output voltage of the NMOS circuit 53c is lowered. The voltage input to the negative input terminal of comparator 53a via the negative feedback wiring 53h falls and becomes lower than the voltage input to the positive input terminal. The comparator 53a outputs a High signal, which turns off the second N-type MOSFET 53c2 and turns on the first N-type MOSFET 53c1, thereby increasing the output voltage of the NMOS circuit 53c. The voltage input to the negative input terminal of the comparator 53a via the negative feedback wiring 53h rises and becomes higher than the voltage input to the positive input terminal. The comparator 53a outputs a Low signal again, the second N-type MOSFET 53c2 is turned on, and the first N-type MOSFET 53c1 is turned off, thereby lowering the output voltage of the NMOS circuit 53c.

The waveform generated by the above operation in the NMOS circuit 53c is averaged through a low-pass filter 53e and output. Therefore, the output waveform of the amplifier 53 has a pulsating, wavy shape. When the amplifier 53 should output an approximately constant voltage, the output waveform of the amplifier 53 will pulsate, which may prevent the generation of an accurate drive waveform and may worsen the accuracy of ink ejection and the accuracy of the image formed on the printing sheet 200.

FIG. 12 is a graph showing the output voltage of the amplifier 53 when the first process is performed. The control circuit 51 performs the first process. When the detection circuit 57 detects the first voltage, the control circuit 51 closes the switch 531, while when the detection circuit 57 does not detect the first voltage, the control circuit 51 opens the switch 531. When the detection circuit 57 detects the second voltage, the enable function of the gate driver circuit 53b is turned off, while when the detection circuit 57 does not detect the second voltage, the enable function of the gate driver circuit 53b is turned on.

As indicated by a letter "A" in FIG. 12, when the detection circuit 57 detects the second voltage for a particular time, the enable function of the gate driver circuit 53b is turned off for a particular time, so the voltage input to the negative input terminal of the comparator 53a via the negative feedback wiring 53h becomes constant for a particular time and the output waveform of the amplifier 53 has a linear shape in the vicinity of Vs.

As indicated by a letter "B" in FIG. 12, when the detection circuit 57 detects the first voltage for a particular time, the control circuit 51 closes the switch 531 for a particular time, so the output voltage of the comparator 53a is maintained at 0V for a particular time, the second N-type MOSFET 53c2 remains ON for a particular time, and the output waveform of the amplifier 53 has a linear shape in the vicinity of 0V. That is, when the amplifier 53 should output an approximately constant voltage, the amplifier 53 outputs an approximately constant voltage. Therefore, generation of accurate drive waveforms can be achieved.

Hereinafter, a printing device according to a second modification will be described with reference to drawings. Among the configurations for second modification, the same symbols are attached to configurations similar to those of the above-described embodiment or the first modification, and detailed descriptions thereof are omitted.

Figure 13:
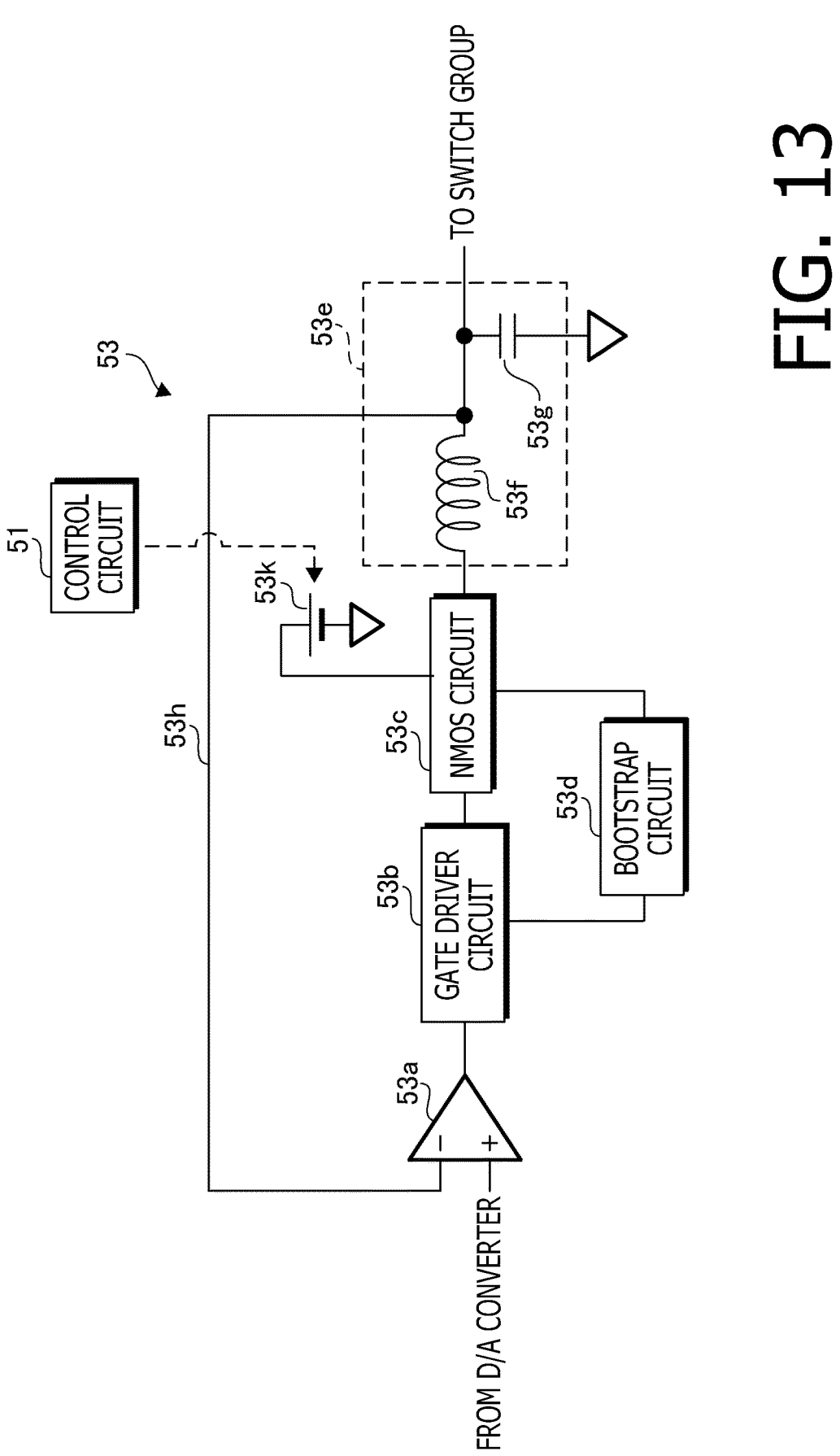
FIG. 13 is a circuit diagram schematically showing an amplifier of the printing device, a control circuit and a detection circuit.

FIG. 13 schematically shows a circuit diagram of the amplifier 53 and the control circuit 51. In the second modification, a power supply of the amplifier 53 is configured as a single power supply, which is configured to supply a voltage of 0V or higher. The voltage of the first power supply 53k is variable. The control circuit 51 is configured to change the voltage of the first power supply 53k. The control circuit 51 is configured to read the drive waveform data stored in the memory 55 and output the drive waveform data as digital data to the D/A converter 52. The drive waveform data contains information indicating multiple signal levels. The D/A converter 52 outputs an analog signal of one of the multiple signal levels. The amplification factor of the amplifier 53 is variable, e.g., 10 times. The user can pre-set the amplification factor of the amplifier 53.

The control circuit 51 obtains drive waveform data from the memory 55, and when the obtained drive waveform data represents signal of 0 volts, that is, when a signal indicating 0 volts is input to the control circuit 51 as a signal indicating the target voltage to be output from the amplifier 53, the control circuit 51 transmits, to the D/A converter 52, a signal indicating a voltage of lower than 0 volts. That is, the control circuit 51 inputs a voltage of lower than 0 volts to the positive terminal of comparator 53*a* via the D/A converter 52.

When the control circuit 51 obtains the drive waveform data from the memory 55 and the obtained drive waveform data indicates a voltage higher than 0 volts and an approximately constant voltage that should be output by the amplifier 53 for a particular period, for example, a maximum voltage value Vs that is input to the positive input terminal of the comparator 53*a* for a particular period, the control circuit 51 changes the supply voltage of the first power supply 53*k* to the target voltage Vs. Further, the control circuit 51 causes the D/A converter 52 to select the level of the signal output from the D/A converter 52 in such a manner that a product of the voltage input to the positive terminal of the comparator 53*a* and the amplification factor of the amplifier 53 is higher than the target voltage Vs, or the supply voltage. In other words, when the target voltage is higher than 0 volts, the control circuit 51 changes the supply voltage of the first power supply 52*k* to the target voltage, which is lower than the product of the voltage input to the positive terminal of the comparator 53*a* and the amplification factor of the amplifier 53. Hereinafter, the process of changing the supply voltage to the target voltage and the process of making the product of the voltage input to the positive terminal of the comparator 53*a* and the amplification factor of the amplifier 53 higher than the target voltage is referred to as a second process.

FIG. 14 is a graph showing the output voltage of the amplifier when the second process is not performed. When the second process is not executed, the control circuit 51 does not change the supply voltage of the first power supply 52*k* at all times and does not change the level of the signal output to the D/A converter 52. In other words, when the second process is not performed, the voltage of the first power supply 52*k* is not variable and the D/A converter 52 is in the same state as if it does not have the ability to change the output signal level.

As indicated by a letter "C" in FIG. 14, the output waveform of the amplifier 53 pulsates in waves near 0 volts. As indicated by a letter "D" in FIG. 14, the output waveform of the amplifier 53 pulsates in waves around Vs. In FIG. 14, the supply voltage Vk of the first power supply 53*k* is greater than the maximum voltage value Vs. That is, when the amplifier 53 should output an approximately constant voltage, the output waveform of the amplifier 53 is wavy. The reason for this is the same as that described in the first modification.

FIG. 15 shows the output voltage of the amplifier when the second process is performed. The control circuit 51 performs the second process. When a signal indicating 0 volts is input to the control circuit 51, the control circuit 51 inputs a voltage lower than 0 volts to the positive terminal of the comparator 53*a* via the D/A converter 52. As described above, the power supply of the amplifier 53 is configured as a single power supply, which is configured to supply a voltage of 0 volts or higher, and the comparator 53*a* cannot output a voltage of lower than 0 volts. Therefore, as indicated by a letter "C" in FIG. 15, when a voltage of lower than 0 volts is input to the positive terminal for a particular time, the comparator 53*a* outputs 0 volts, i.e., a Low signal, and the amplifier 53 outputs 0 volts for a particular time.

As shown in FIG. 15, when the obtained drive waveform data indicates the maximum voltage value Vs that is input to the positive input terminal of the comparator 53*a* for a particular period, the control circuit 51 changes the supply voltage Vk of the first power supply 53*k* to the target voltage Vs. Further, as shown by the single-dotted line in FIG. 15, the control circuit 51 changes the level of the output signal of the D/A converter 52 so that the product Vp of the voltage input to the positive terminal of the comparator 53*a* and the amplification factor of the amplifier 53 is higher than the target voltage Vs, or the supply voltage Vk. As indicated by a letter "D" in FIG. 15, the output voltage of the amplifier 53 is fixed to the supply voltage Vk, since the amplifier 53 cannot amplify a voltage to exceed the supply voltage Vk. By performing the second process as described above, the amplifier 53 outputs an approximately constant voltage when the amplifier 53 should output an approximately constant voltage. Therefore, generation of accurate drive waveforms can be achieved.

Figure 16:
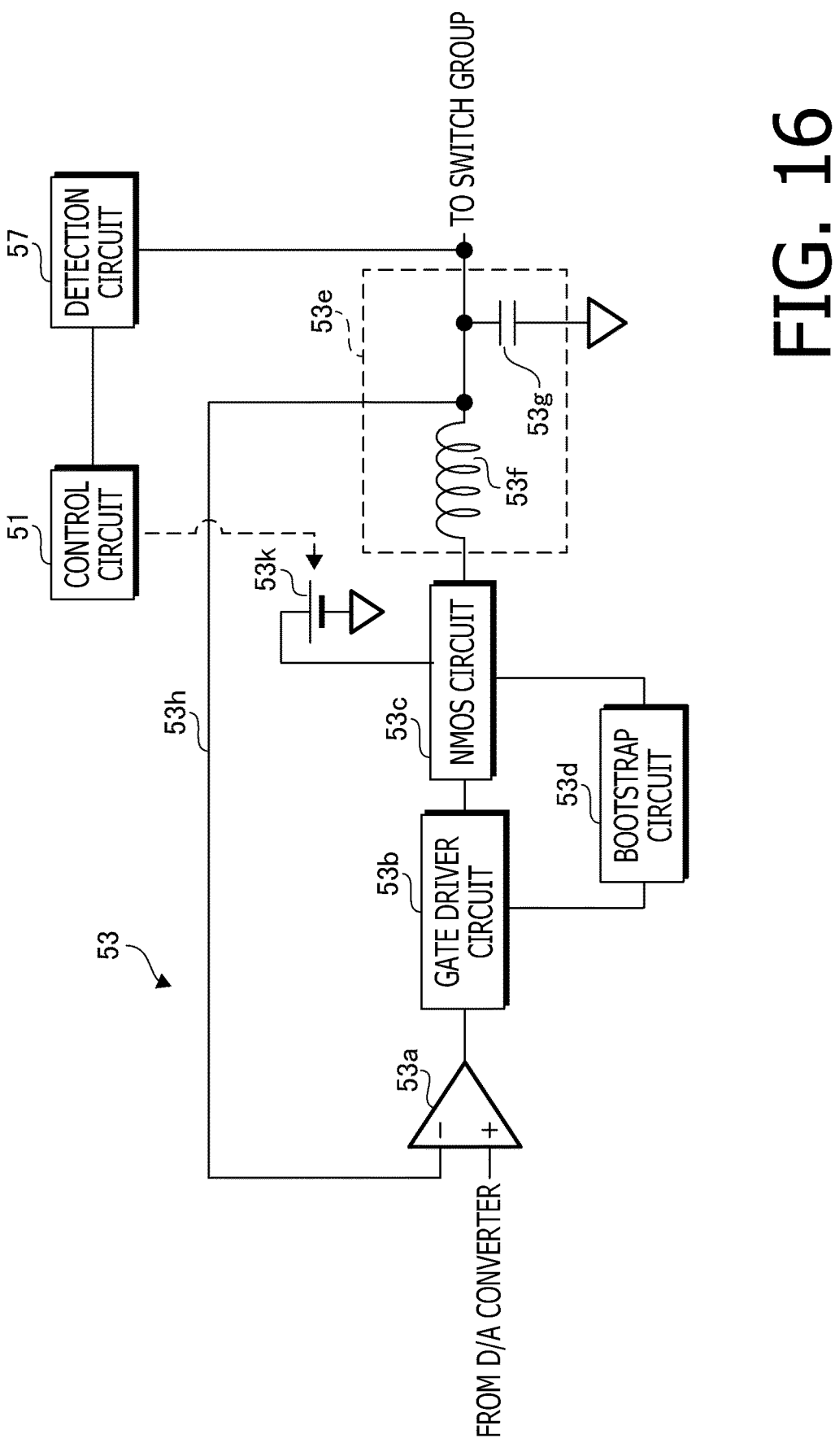
FIG. 16 is a circuit diagram schematically showing an amplifier of the printing device, a control circuit and a detection circuit.

Hereinafter, the printing device 1 according to a third modification will be explained with reference to the drawings. FIG. 16 is a circuit diagram that schematically shows the amplifier 53, the control circuit 51, and the detection circuit 57. Among the configurations for the third modification, configurations similar to those in the first modification or the second modification are assigned with the same symbols and descriptions thereof are omitted. In the third modification, the printing device 1 is equipped with the detection circuit 57. The detection circuit 57 is configured to detect the output voltage of the amplifier 53 and output information regarding the detected voltage to the control circuit 51.

When the detection circuit 57 detects the first voltage with respect to 0 volts (see the first modification), the control circuit 51 outputs a signal to the D/A converter 52 indicating a voltage lower than 0 volts. That is, the control circuit 51 inputs a voltage of lower than 0 volts to the positive terminal of comparator 53*a* via D/A converter 52.

When the detection circuit 57 detects the second voltage with respect to the voltage other than 0 volts (see the first modification), the control circuit 51 changes the supply voltage of the first power supply 53*k* to the target voltage Vs. Further, the control circuit 51 changes the level of the output signal of the D/A converter 52 in such a manner that the product of the voltage input to the positive terminal of the comparator 53*a* and the amplification factor of the amplifier 53 is higher than the target voltage Vs, that is, the supply voltage. In other words, when the target voltage is higher than 0 volts, the control circuit 51 changes the supply voltage of the first power supply 52*k* to a voltage lower than the product of the target voltage, the voltage input to the positive terminal of the comparator 53*a*, and the amplification factor of the amplifier 53. That is, the control circuit 51 performs the second process described above (see the second modification) based on the detection results of the detection circuit 57.

Figure 17:
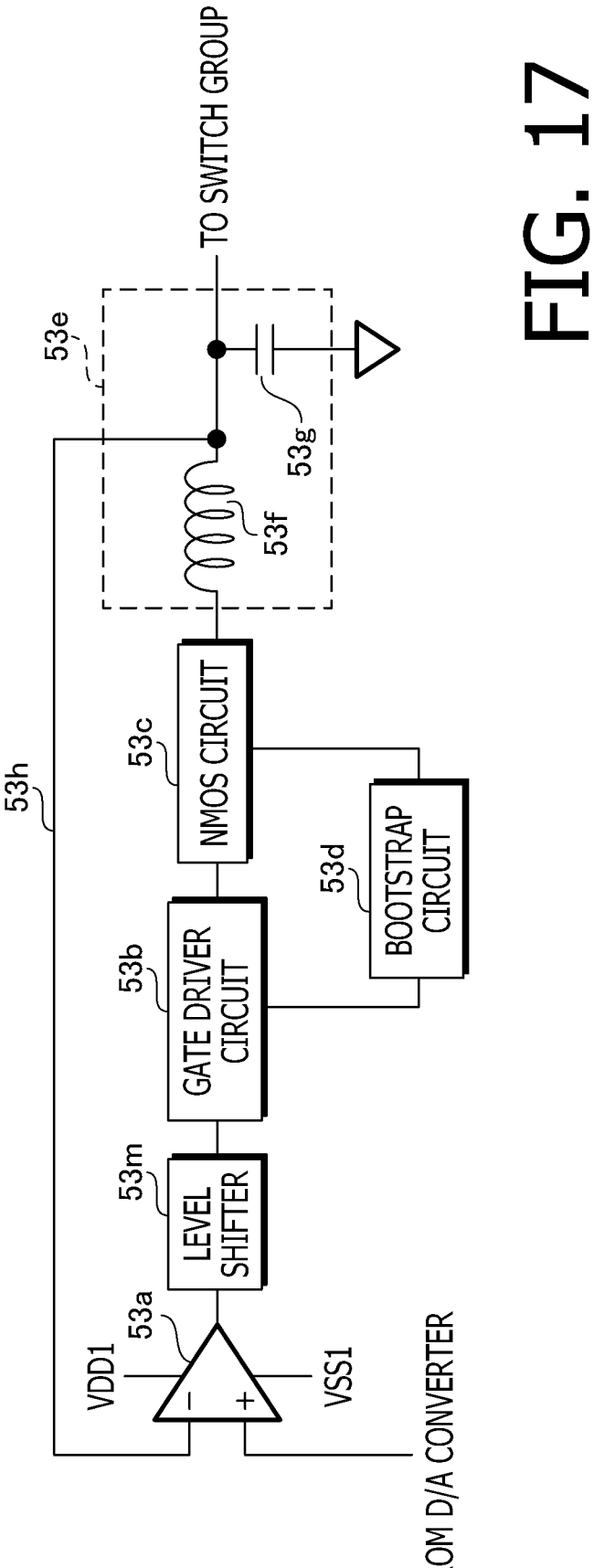
FIG. 17 is a circuit diagram schematically shows a configuration of an amplifier.

FIG. 17 is a circuit diagram according to a fourth modification that schematically illustrates a configuration of the amplifier 53. Amplifier 53 is a self-excited digital amplifier. The amplifier 53 has a comparator 53*a*, a level shifter 53*m*, a gate driver circuit 53*b*, an NMOS circuit 53*c*, a bootstrap circuit 53*d*, a low-pass filter 53*e*, and negative feedback wiring 53*h*.

The comparator 53*a* is connected to a positive power supply VDD1 and a negative power supply VSS1. That is, since the comparator 53*a* is connected to the positive power supply VDD1 and the negative power supply VSS1, the comparator 53*a* is in a dual power supply configuration. To the NMOS circuit 53*c*, the positive power supply VDD2 and the negative power supply VSS2 are connected (see FIG. 18). A level shifter 53*m* has, for example, a Zener diode and changes the level of the signal input from the comparator 53a to compensate for the difference in the reference voltages of the negative power supply VSS1 and the negative power supply VSS2.

The positive input terminal of the comparator 53a is connected to the D/A converter 52, and the analog signal from the D/A converter 52 is input to the positive input terminal of the comparator 53a. The output terminal of the comparator 53a is connected to the gate driver circuit 53b via the level shifter 53m, and the output signal of the comparator 53a is input to the gate driver circuit 53b after the signal level is changed by the level shifter 53m. A gate driver circuit 53b is connected to the NMOS circuit 53c and outputs an ON or OFF signal to the NMOS circuit 53c based on the output signal transmitted from the comparator 53a. The NMOS circuit 53c is driven by the ON or OFF signal transmitted from the gate driver circuit 53b and outputs a signal to the low-pass filter (LPF) 53e.

The low-pass filter 53e has an inductor 53f and a capacitor 53g. One end of the inductor 53f is connected to the NMOS circuit 53c, and the other end is connected to one end of the capacitor 53g. The other end of the capacitor 53g is connected to the ground. The other end of the inductor 53f and one end of the capacitor 53g are connected to the switch group 54(n). That is, the low-pass filter 53e outputs, to the switch group 54(n), a signal, that is, a time-division multiplexed signal generated by amplifying the analog signal. One end of the negative feedback wiring 53h is connected to the other end of the inductor 53f and one end of the capacitor 53g, while the other end of the negative feedback wiring 53h is connected to the negative input terminal of the comparator 53a. The bootstrap circuit 53d is connected to the gate driver circuit 53b and the NMOS circuit 53c.

Figure 18:
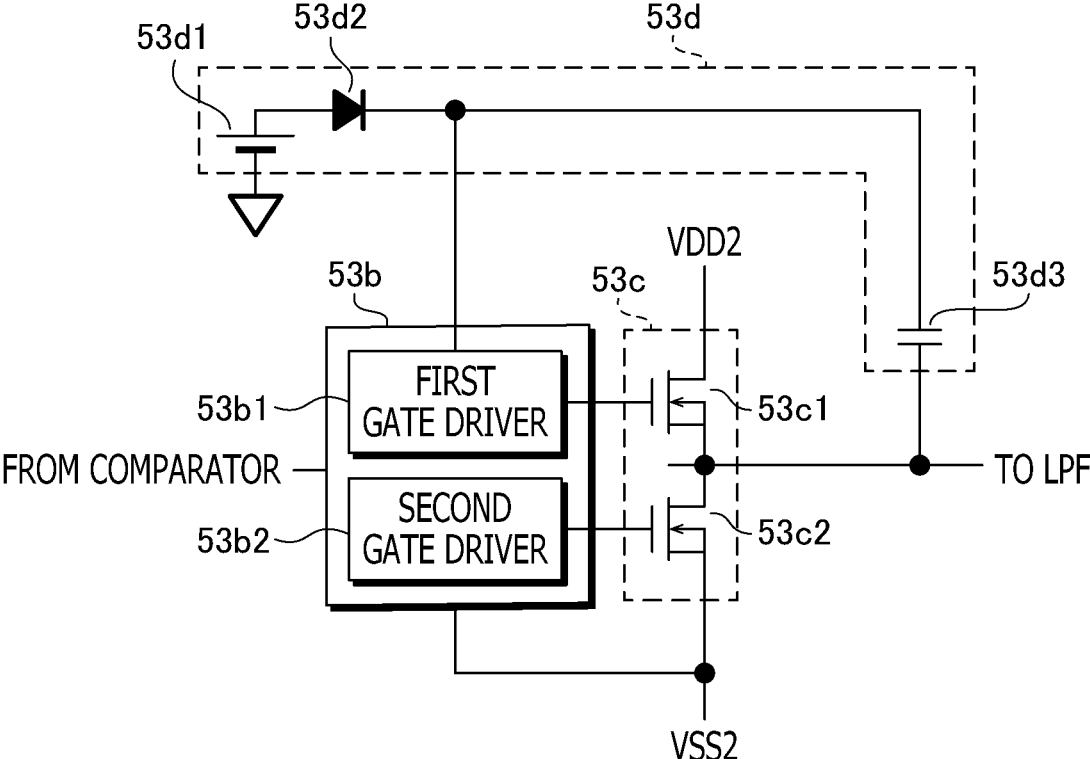
FIG. 18 is a circuit diagram schematically showing configurations of a gate driver circuit, an NMOS circuit and a bootstrap circuit.

FIG. 18 is a circuit diagram that schematically shows configurations of the gate driver circuit 53b, the NMOS circuit 53c, and the bootstrap circuit 53d. The gate driver circuit 53b has a first gate driver 53b1 and a second gate driver 53b2. The NMOS circuit 53c has a first N-type MOSFET 53c1 and a second N-type MOSFET 53c2. The first gate driver 53b1 is connected to the gate of the first N-type MOSFET 53c1. The second gate driver 53b2 is connected to the gate of the second N-type MOSFET 53c2. A drain of the first N-type MOSFET 53c1 is connected to the positive power supply VDD2. A source of the first N-type MOSFET 53c1 is connected to a drain of the second N-type MOSFET 53c2. The source of the second N-type MOSFET 53c2 is connected to the negative power supply VSS2. The source of the first N-type MOSFET 53c1 and the drain of the second N-type MOSFET 53c2 are connected to one end of the low-pass filter (LPF) 53e, or the inductor 53f. That is, the negative feedback wiring 53h is connected to the source of the first N-type MOSFET 53c1 and the drain of the second N-type MOSFET 53c2 via the low-pass filter 53e. The gate driver circuit 53b is connected to the negative power supply VSS2.

The bootstrap circuit 53d has a positive power supply 53d1, a diode 53d2, and a bootstrap capacitor 53d3. A negative terminal of the positive power supply 53d1 is connected to the ground, while a positive terminal of the positive power supply 53d1 is connected to an anode of the diode 53d2. A cathode of the diode 53d2 is connected to one end of the bootstrap capacitor 53d3. The other end of the bootstrap capacitor 53d3 is connected to the source of the first N-type MOSFET 53c1 and the drain of the second N-type MOSFET 53c2. Further, the cathode of diode 53d2 and one end of the bootstrap capacitor 53d3 are connected to the first gate driver 53b1. That is, the first gate driver 53b1 is connected to the positive power supply 53d1 via the diode 53d2. As described above, the gate driver circuit 53b is connected to the negative power supply VSS2 and the first gate driver 53b1 is connected to the positive power supply 53d1, so the gate driver circuit 53b has a dual power supply configuration.

When the voltage input to the positive input terminal of the comparator 53a is lower than the voltage input to the negative input terminal, the comparator 53a outputs a Low signal to the gate driver circuit 53b. When the Low signal is input to the gate driver circuit 53b, the second gate driver 53b2 outputs an ON signal to the gate of the second N-type MOSFET 53c2, while the first gate driver 53b1 does not output an ON signal to the gate of the first N-type MOSFET 53c1. That is, the second N-type MOSFET 53c2 becomes conductive and the first N-type MOSFET 53c1 does not become conductive. Therefore, the other end of the bootstrap capacitor 53d3 is connected to the ground, and the bootstrap capacitor 53d3 is charged by the positive power supply 53d1. In other words, the bootstrap capacitor 53d3 is charged when the second N-type MOSFET 53c2 becomes conductive.

If the voltage input to the positive input terminal of the comparator 53a becomes higher than the voltage input to the negative input terminal after the completion of charging the bootstrap capacitor 53d3, the comparator 53a outputs a High signal to the gate driver circuit 53b. When the High signal is input to the gate driver circuit 53b, the first gate driver 53b1 outputs an ON signal to the gate of the first N-type MOSFET 53c1, while the second gate driver 53b2 does not output the ON signal to the gate of the second N-type MOSFET 53c2. That is, the first N-type MOSFET 53c1 becomes conductive, while the second N-type MOSFET 53c2 does not.

Assuming that the voltage at the source of the first N-type MOSFET 53c1 when the second N-type MOSFET 53c2 is not conductive is VS and the voltage applied to both ends of the charged bootstrap capacitor 53d3 is VC, the voltage at one end of the bootstrap capacitor 53d3 is VS+VC. Therefore, the first gate driver 53b1 can output, to the gate of the first N-type MOSFET 53c1, a signal with a higher voltage than the voltage VS of the source of the first N-type MOSFET 53c1, that is, an ON signal. That is, the first gate driver 53b1 causes the first N-type MOSFET 53c1 to be conductive by the voltage after the bootstrap capacitor 53d3 is charged. In other words, the first N-type MOSFET 53c1 cannot be made to be conductive until after the bootstrap capacitor 53d3 is charged. When the first N-type MOSFET 53c1 is conductive, a signal based on the voltage of the power supply VDD2 is output to the low-pass filter 53e.

When the network interface 56 receives a print job, that is, when the network interface 56 receives a print job via the network interface 56 and stores the print job in the memory 55, the control circuit 51 causes the second N-type MOSFET 53c2 to be conductive to charge the bootstrap capacitor 53d3. That is, the control circuit 51 can cause the bootstrap capacitor 53D3 to be charged before starting printing.

In the above-described modification, the amplifier 53 (amplifier circuit) is a self-excited digital amplifier, and the configuration thereof is simpler than that of other-excited digital amplifiers. Therefore, it is possible to suppress the enlargement of the amplifier circuit.

Figure 19:
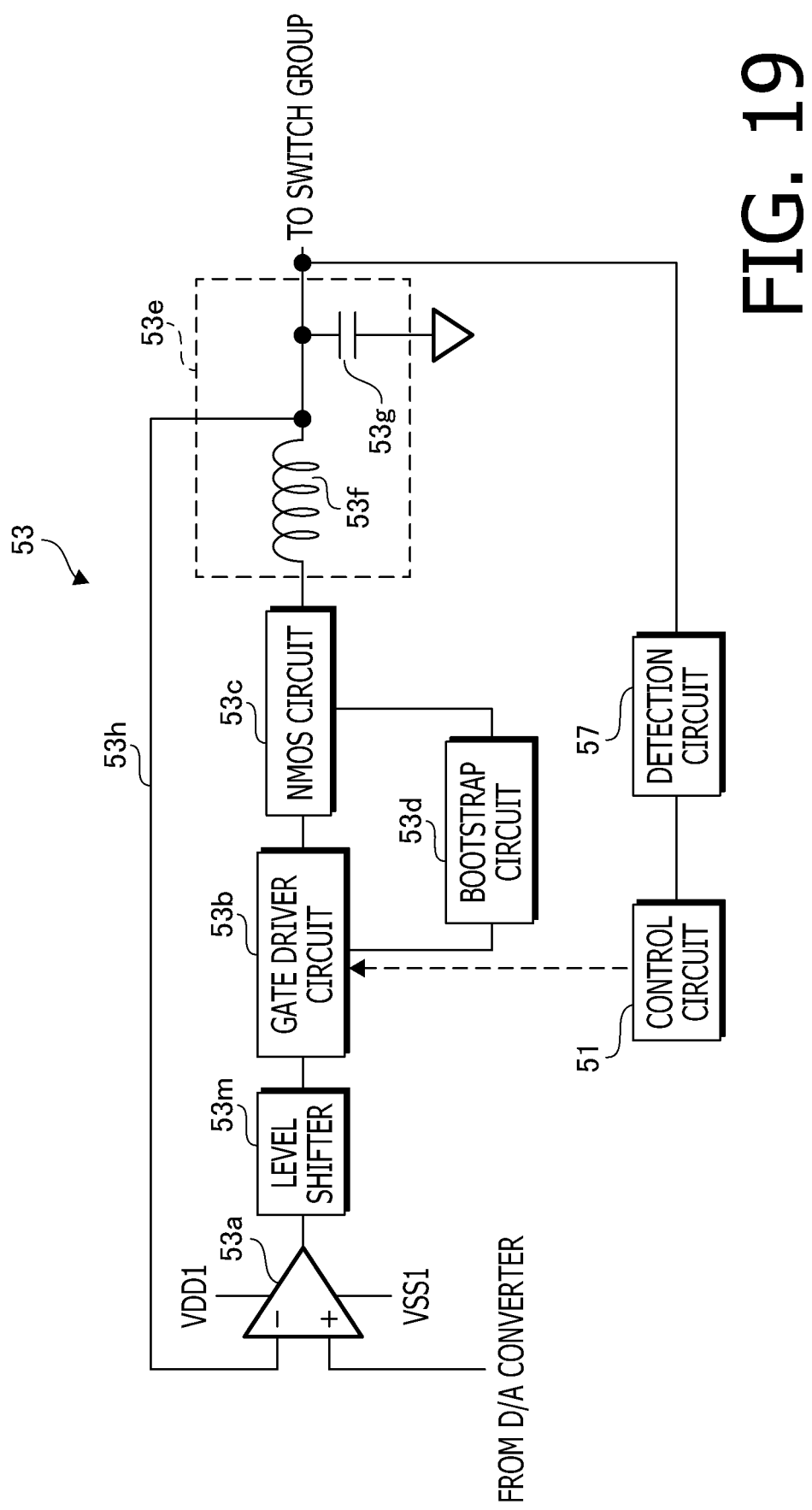
FIG. 19 is a circuit diagram schematically showing an amplifier of the printing device, a control circuit and a detection circuit.

Hereinafter, the printing device 1 according to a fifth modification will be described with reference to the drawings. FIG. 19 is a circuit diagram showing the configuration of the amplifier 53, the control circuit 51, and the detection circuit 57. Among the components of the fifth embodiment, components similar to those of the above-described embodiment and modifications are assigned with the same symbols and the detailed description thereof is omitted.

In the fifth modification, the gate driver circuit 53*b* has an enable function. When the enable function of the gate driver circuit 53*b* is turned on, that is, when the gate driver circuit 53*b* is in an effective state to perform output according to the output of the comparator 53*a*, the first gate driver 53*b*1 can turn ON or OFF the first N-type MOSFET 53*c*1, and the second gate driver 53*b*2 can turn ON or OFF the second N-type MOSFET 53*c*2, according to the output of the comparator 53*a*.

When the enable function of gate driver circuit 53*b* is turned off, i.e., when the gate driver circuit 53*b* is in an ineffective state that the gate driver circuit 53*b* does not output according to the output of the comparator 53*a*, the first gate driver 53*b*1 forcibly turns off the first N-type MOSFET 53*c*1 and the second gate driver 53*b*2 forcibly turns off the second N-type MOSFET 53*c*2. The control circuit 51 is configured to turn ON or OFF the enable function of the gate driver circuit 53*b*. That is, the gate driver circuit 53*b* can switch between the effective and ineffective states, and the control circuit 51 is configured to cause the gate driver circuit 53*b* in the effective or ineffective state.

The printing device 1 is equipped with a detection circuit 57. The detection circuit 57 detects the output voltage of the amplifier 53 and outputs information regarding the detected voltage to the control circuit 51. The detection circuit 57 corresponds to the voltage detector. When the detection circuit 57 detects a first voltage with respect to 0 volts, the control circuit 51 turns off the enable function of the gate driver circuit 53*b*. That is, control circuit 51 sets the gate driver circuit 53*b* to the ineffective state. The first voltage is a voltage within a particular range with respect to 0 volts, e.g., 0 to 0.5 V.

When the detection circuit 57 detects a second voltage with respect to a voltage other than 0 volts, the control circuit 51 turns off the enable function of the gate driver circuit 53*b*. That is, control circuit 51 sets the gate driver circuit 53*b* to the ineffective state. The second voltage is an approximately constant voltage that should be output by the amplifier 53 for a particular period of time, and is, for example, a voltage within a particular range with respect to the maximum voltage value Vs that is input to the positive input terminal of the comparator 53*a* for a particular period of time. For example, the voltage is in the range of Vs−0.5 to Vs+0.5V. It is noted that the maximum value Vs is stored in the memory 55 in advance. The second voltage is not necessarily limited to a voltage within a particular range with respect to the maximum voltage value Vs, but may be a voltage within a particular range with respect to a voltage other than 0 volts. Hereinafter, the process of turning off the enable function of the gate driver circuit 53*b* is referred to as the first process.

As indicated by a letter "B" in FIG. 12, when the detection circuit 57 detects the first voltage for a particular time, the enable function of the gate driver circuit 53*b* is turned off for a particular time, so the voltage input to the negative input terminal of the comparator 53*a* via the negative feedback wiring 53*h* becomes constant for a particular time, and the output waveform of the amplifier 53 has a linear shape in the vicinity of 0 V. That is, when the amplifier 53 should output an approximately constant voltage, the amplifier 53 outputs an approximately constant voltage. Therefore, it is possible to generate drive waveforms, accurately.

Figure 20:
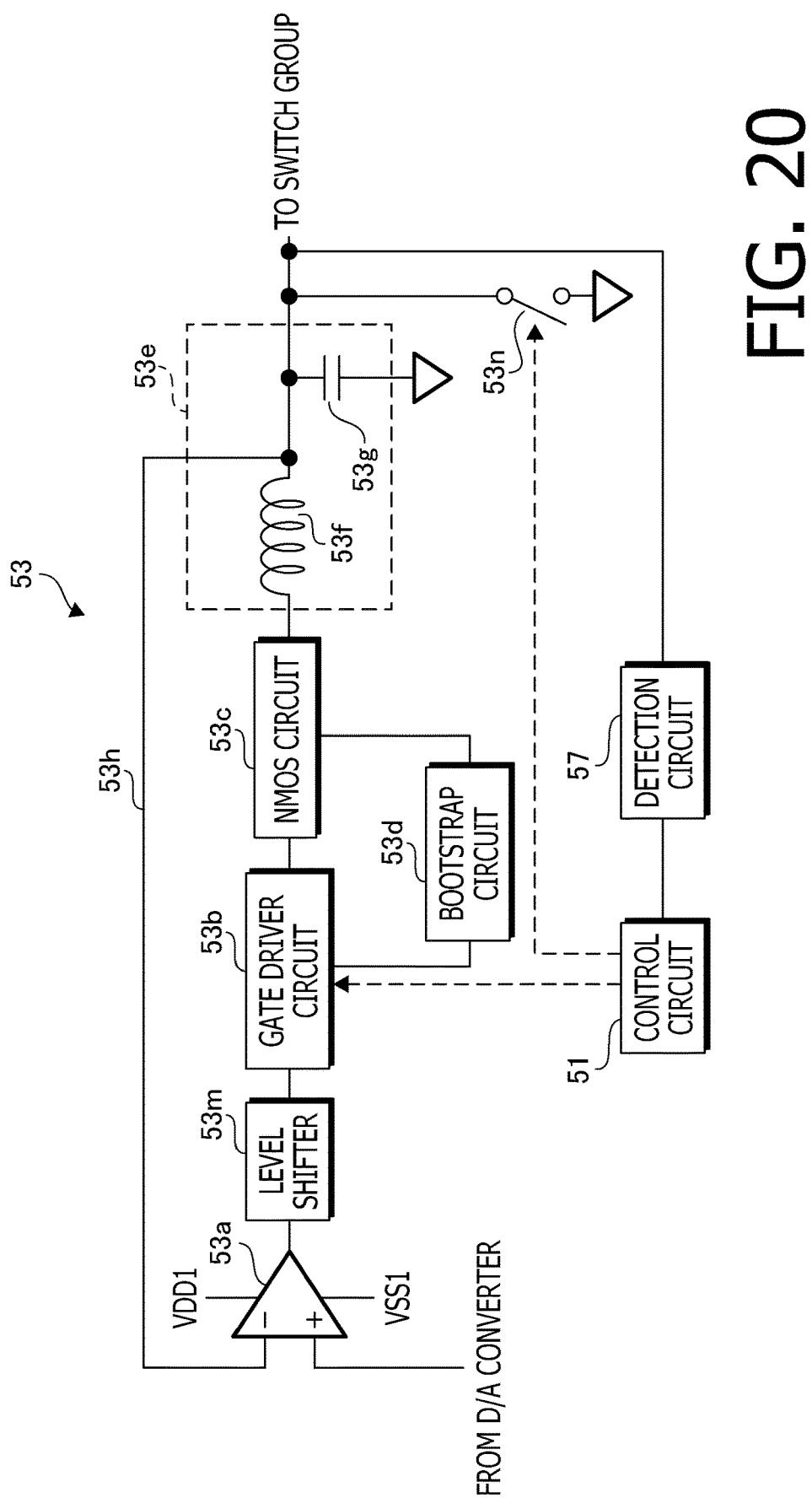
FIG. 20 is a circuit diagram schematically showing an amplifier of the printing device, a control circuit and a detection circuit.

Hereinafter, a printing device 1 according to a sixth modification will be described based on the drawings. Among the components of the sixth modification, elements similar to those of the above-described embodiment and modifications are assigned with the same symbols, and a detailed description thereof is omitted. FIG. 20 is a circuit diagram showing the configuration of the amplifier 53, the control circuit 51, and the detection circuit 57.

In the sixth modification, unlike the fifth modification, the amplifier 53 is equipped with a switch 53*n*. The switch 53*n* is configured to switch connection and disconnection of the output side of the low-pass filter 53*e*, i.e., the output terminal of the amplifier 53, and the ground. The control circuit 51 controls the opening and closing of the switch 53*n*. It is noted that the switch 53*n* does not have to be included in the amplifier 53 and may be used as a component outside of the amplifier 53. The printing device 1 according to the sixth modification has the same configuration as the fifth modification, except that equipped with the switch 53*n*.

When the detection circuit 57 detects the first voltage, the control circuit 51 closes switch 531, while when the detection circuit 57 does not detect the first voltage, the control circuit 51 opens switch 531. When the detection circuit 57 detects the second voltage, the enable function of the gate driver circuit 53*b* is turned off, while when the detection circuit 57 does not detect the second voltage, the enable function of the gate driver circuit 53*b* is turned on.

When the detection circuit 57 detects the first voltage for a particular period of time, the control circuit 51 turns off the enable function of the gate driver circuit 53*b* and closes the switch 53*n* for a particular period of time. The output waveform of the amplifier 53 has a linear shape near 0 V. That is, when the amplifier 53 should output an approximately constant voltage, the amplifier 53 outputs an approximately constant voltage. Therefore, accurate generation of the drive waveform can be achieved.

In the case of the fifth modification, even if the detection circuit 57 detects the first voltage for a particular period of time and the control circuit 51 executes the first process, in other words, even if the enable function of the gate driver circuit 53*b* is turned off, an offset voltage may remain near 0 V. However, in the sixth modification, the switch 53*n* is closed, and generation of the offset voltage can be prevented.

Figure 21:
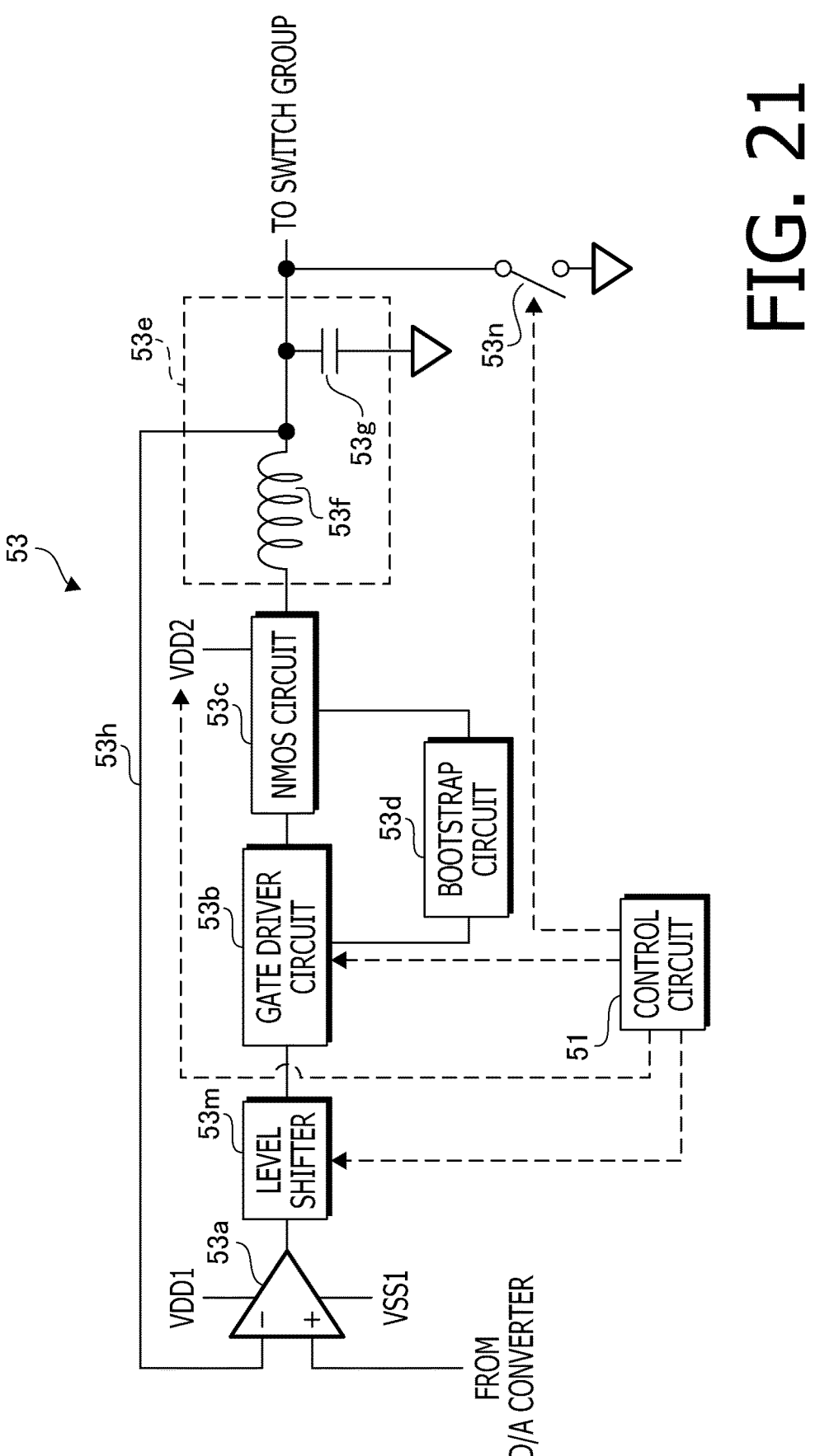
FIG. 21 is a circuit diagram schematically showing an amplifier of the printing device, a control circuit and a detection circuit.

Hereinafter, the printing device 1 according to a seventh modification will be described with reference to drawings. Among the components of the seventh modification, components similar to those of the above-described embodiment and modifications are assigned with the same symbols, and the detailed description thereof is omitted. FIG. 21 is a circuit diagram that schematically shows the configuration of the amplifier 53 and the control circuit 51. The gate driver circuit 53*b* has an enable function. The control circuit 51 is configured to turn ON or OFF the enable function of the gate driver circuit 53*b*. The D/A converter 52 can change the level of the signal output from the D/A converter 52, i.e., the level of the signal input to the amplifier 53.

The voltage of the positive power supply VDD2 of the NMOS circuit 53*c* is variable. The control circuit 51 can change the voltage of the positive power supply VDD2. The amplifier 53 is provided with a switch 53*n*, which is configured to connect the output of low-pass filter 53*e* to the ground or release the connection therebetween. The control circuit 51 controls the opening and closing of the switch 53*n*. The control circuit 51 retrieves the drive waveform data stored in the memory 55 and outputs the drive waveform data as digital data to the D/A converter 52. The drive waveform data contains information representing multiple signal levels. The D/A converter 52 outputs an analog signal of one of the signal levels. The amplification factor of amplifier 53 has a variable value, which is, for example, 10. The user can pre-set the amplification factor of the amplifier 53.

The control circuit 51 obtains the drive waveform data from the memory 55. If the obtained drive waveform data is a signal indicating 0 volts, that is, if a signal indicating 0 volts is input to the control circuit 51 as a signal indicating the target voltage to be output from the amplifier 53, the control circuit 51 turns off the gate driver circuit 53*b*'s enable function and closes the switch 53*n* for a particular period of time. Therefore, the output waveform of the amplifier 53 has a linear shape around 0 V. Hereafter, the process of turning off the enable function of the gate driver circuit 53*b* and closing the switch 53*n* for a particular period of time is referred to as a third process.

When the control circuit 51 obtains the drive waveform data from the memory 55 and the obtained drive waveform data represents a voltage higher than 0 volts and an approximately constant voltage that should be output by the amplifier 53 for a particular period, for example, a maximum voltage value Vs that is to be input to the positive input terminal of the comparator 53*a* for a particular period, the control circuit 51 changes the supply voltage of power supply VDD2 to the target voltage Vs.

Further, the control circuit 51 causes the D/A converter 52 to select the level of the signal output from the D/A converter 52 so that the product of the voltage input to the positive terminal of the comparator 53*a* and the amplification factor of the amplifier 53 is higher than the target voltage Vs, or the supply voltage. In other words, if the target voltage is higher than 0 volts, the control circuit 51 changes the supply voltage of the power supply VDD2 to a voltage lower than the product of the target voltage, which is the voltage input to the positive terminal of the comparator 53*a*, and the amplification factor of the amplifier 53. Hereafter, the process of changing the supply voltage to the target voltage and the process of making the product of the voltage input to the positive terminal of comparator 53*a* and the amplification factor of amplifier 53 higher than the target voltage is referred to as a fourth process.

FIG. 14 is a graph showing the output voltage of the amplifier 53 when both the third and fourth processes are not performed. When the third process is not executed, the control circuit 51 turns on the enable function of the gate driver circuit 53*b* at all times and opens the switch 53*n* at all times. In other words, a state where the third process is not performed is the same as a state where the amplifier 53 does not have the switch 53*n* and the gate driver circuit 53*b* does not have the enable function. When the fourth process is not executed, the control circuit 51 does not change the supply voltage of the constant power supply VDD2 and does not change the level of the signal output from the D/A converter 52. In other words, when the fourth process is not executed, the voltage of the power supply VDD2 is not variable, and the D/A converter 52 operates as if it does not have a function to change the level of the output signal.

As indicated by a letter "C" in FIG. 14, the output waveform of the amplifier 53 pulsates in waves near 0 volts. As indicated by a letter "D" in FIG. 14, the output waveform of the amplifier 53 pulsates in waves around Vs. That is, when the amplifier 53 should output an abbreviated constant voltage, the output waveform of the amplifier 53 becomes wavy. The reason for this is the same as that described in the fifth modification. In FIG. 14, the supply voltage Vk of the power supply VDD2 is greater than the maximum voltage value Vs.

FIG. 15 is a graph showing the output voltage of the amplifier 53 when the third and fourth processes are performed. When a signal indicating 0 volts is input to the control circuit 51, the control circuit 51 executes the third process. The control circuit 51 turns off the enable function of the gate driver circuit 53*b* and closes the switch 53*n* for a particular period of time.

As indicated by a letter "C" in FIG. 15, the output waveform of the amplifier 53 has a linear shape around 0 V.

When the obtained drive waveform data is a voltage higher than 0 volts and represents an approximately constant voltage that should be output by the amplifier 53 for a particular period, for example, the maximum voltage value Vs that is input to the positive input terminal of the comparator 53*a* for a particular period, the control circuit 51 executes the fourth process. As shown in FIG. 15, the control circuit 51 changes the supply voltage Vk of the power supply VDD2 to the target voltage Vs. Further, as indicated by the single-dotted line in FIG. 15, the control circuit 51 changes the level of the output signal of the D/A converter 52 so that the product Vp of the voltage input to the positive terminal of the comparator 53*a* and the amplification factor of the amplifier 53 is higher than the target voltage Vs, i.e., higher than the supply voltage Vk. By executing the third process as described above, the amplifier 53 outputs an approximately constant voltage when the amplifier 53 should output an approximately constant voltage. Therefore, generation of the accurate drive waveform can be realized.

Figure 22:
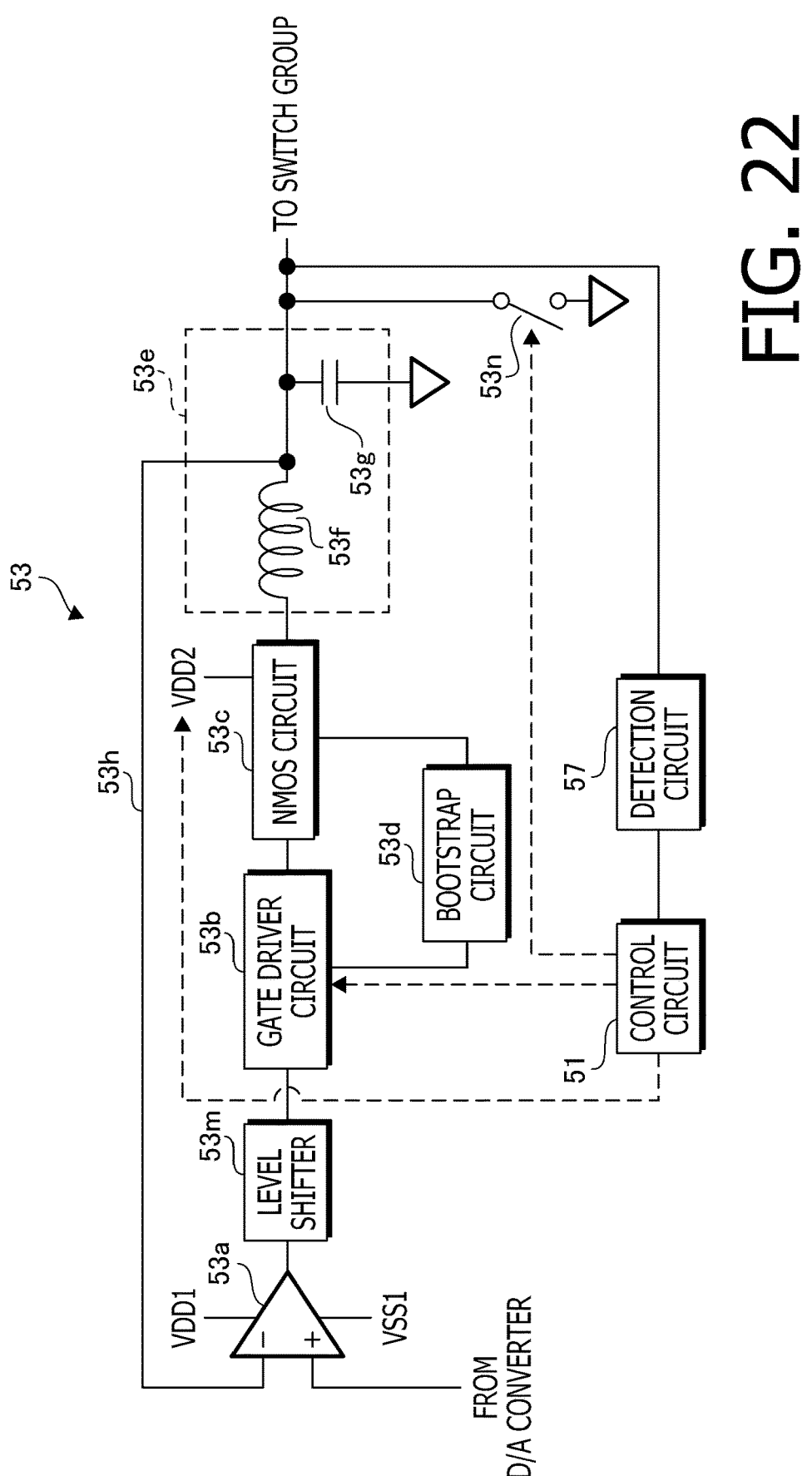
FIG. 22 is a circuit diagram schematically showing an amplifier of the printing device, a control circuit and a detection circuit.

Hereinafter, the printing device 1 according to an eighth modification will be described with reference to the drawings. FIG. 22 is a circuit diagram that schematically shows the configuration of the amplifier 53, the control circuit 51 and the detection circuit 57. Among the components of the eighth modification, components similar to those of the above-described embodiment and modifications are assigned with the same symbols, and the detailed description thereof is omitted. In the eighth modification, the printing device 1 is provided with the detection circuit 57. The detection circuit 57 is configured to detect the output voltage of the amplifier 53 and outputs information regarding the detected voltage to the control circuit 51. The voltage of the positive power supply VDD2 of the NMOS circuit 53*c* is variable. The control circuit 51 can change the voltage of the positive power supply VDD2.

When the detection circuit 57 detects the first voltage mentioned above (see the fifth modification) with respect to 0 volts, the control circuit 51 turns off the enable function of the gate driver circuit 53*b* and closes the switch 53*n* for a particular period of time. Therefore, the output waveform of the amplifier 53 has a linear shape around 0 V. That is, the control circuit 51 executes the second process described above (see the seventh modification) based on the detection results of the detection circuit 57.

When the detection circuit 57 detects the second voltage mentioned above (see the fifth modification) with respect to a voltage other than 0 volts, the control circuit 51 changes the supply voltage of the first power supply 53*k* to the target voltage Vs. Further, the control circuit 51 changes the level of the output signal of the D/A converter 52 so that the product of the voltage input to the positive terminal of the comparator 53*a* and the amplification factor of the amplifier 53 is higher than the target voltage Vs, that is, the supply voltage. In other words, if the target voltage is higher than 0 volts, the control circuit 51 changes the supply voltage of the first power supply 52*k* to a voltage lower than the product of the voltage input to the positive terminal of comparator 53*a*, which is the target voltage, and the amplification factor of amplifier 53. That is, the control circuit 51 executes the third process described above (see the seventh modification) based on the detection results of detection circuit 57.

In the above-described embodiment and modifications, the vibrating plate 82, the piezoelectric body 83, the first common electrode 84, the individual electrode 85, and the second common electrode 86 constitute the actuator 88, but the configuration of the actuator 88 is not necessarily limited to the above. The number of common electrodes may be one, and for example, the common electrode may be a two-layer material. The two-layer material includes a vibrating plate 82, a piezoelectric body 83, a common electrode, and an individual electrode 85.

The embodiment and modifications disclosed herein should be considered in all respects illustrative and not restrictive. The scope of the invention is intended to include all modifications within the scope of the claims and the scope equivalent to the claims. The items recited in each of the embodiment and modifications can be combined with each other. Further, the independent and dependent claims recited in the claims may be combined with each other in all possible combinations, regardless of the form of citation.

What is claimed is:

1. A printing device comprising:
an amplifying circuit configured to amplify a drive waveform signal; and
an energy generating element configured to be driven by the drive waveform signal amplified by the amplifying circuit, the energy generating element being configured to eject liquid from a nozzle,
wherein the amplifying circuit includes:
a comparator, the drive waveform signal being input to a positive input terminal of the comparator;
a gate driver, an output signal being input to the gate driver from the comparator;
a first N-type MOSFET configured to be driven by the gate driver; and
a second N-type MOSFET configured to be driven by the gate driver,
wherein a drain of the first N-type MOSFET is connected to a power supply,
wherein a source of the first N-type MOSFET is connected to a drain of the second N-type MOSFET, and
wherein the printing device further comprises negative feedback wiring,
wherein the comparator has the positive input terminal and a negative input terminal, and
wherein the negative feedback wiring is configured to connect the negative input terminal of the comparator to the source of the first N-type MOSFET and the drain of the second N-type MOSFET.

2. The printing device according to claim 1,
wherein the negative feedback wiring is connected to the source of the first N-type MOSFET and the drain of the second N-type MOSFET via a low-pass filter.

3. The printing device according to claim 1, further comprising a controller,
wherein a signal indicating a target voltage to be output from the amplifying circuit is input to the controller, and
wherein the controller is configured to input a voltage of lower than 0 volts to a positive terminal of the comparator when the target voltage is 0 volts.

4. The printing device according to claim 1, further comprising:
a voltage detector configured to detect an output voltage of the amplifying circuit; and
a controller,
wherein the controller is configured to input a voltage of lower than 0 volts to a positive terminal of the comparator when the voltage detector detects a first voltage with respect to 0 volts.

5. The printing device according to claim 1, further comprising a controller,
wherein the power supply is configured to change a supply voltage,
wherein a signal indicating a target voltage to be output from the amplifying circuit is input to the controller, and
wherein the controller is configured to change the supply voltage of the power supply to the target voltage lower than a product of a voltage input to a positive terminal of the comparator and an amplification factor of the amplifying circuit when the target voltage is a voltage of higher than 0 volts.

6. The printing device according to claim 1, further comprising:
a voltage detector configured to detect an output voltage of the amplifying circuit; and
a controller,
wherein the power supply is configured to change a supply voltage,
wherein the controller is configured to change the supply voltage of the power supply to the target voltage lower than a product of a voltage input to a positive terminal of the comparator and an amplification factor of the amplifying circuit when the voltage detector detects a second voltage with respect to a voltage other than 0 volts.

7. The printing device according to claim 1,
wherein a source of the second N-type MOSFET is connected to ground.

8. The printing device according to claim 1, further comprising a level shifter configured to change a level of an output voltage of the comparator,
wherein an output voltage changed by the level shifter is input to the gate driver,
wherein the drain of the first N-type MOSFET is connected to a positive power supply, and
wherein a source of the second N-type MOSFET is connected to a negative power supply.

9. The printing device according to claim 1,
a voltage detector configured to detect an output voltage of the amplifying circuit; and
a controller,
wherein the gate driver configured to switch between an effective state and an ineffective state, the effective state being a state where the gate driver outputs a signal according to an output from the comparator, the ineffective state being a state where the gate driver does not output a signal according to an output from the comparator, and
wherein the controller is configured to set the gate driver to the ineffective state when the voltage detector detects a first voltage with respect to 0 volts.

10. A printing device comprising:
an amplifying circuit configured to amplify a drive waveform signal; and
an energy generating element configured to be driven by the drive waveform signal amplified by the amplifying circuit, the energy generating element being configured to eject liquid from a nozzle, wherein the amplifying circuit includes:

a comparator, the drive waveform signal being input to a positive input terminal of the comparator;

a gate driver, an output signal being input to the gate driver from the comparator;

a first N-type MOSFET configured to be driven by the gate driver; and a second N-type MOSFET configured to be driven by the gate driver, wherein a drain of the first N-type MOSFET is connected to a power supply, wherein a source of the first N-type MOSFET is connected to a drain of the second N-type MOSFET, and wherein the printing device further comprises:

negative feedback wiring configured to connect a negative input terminal of the comparator to the source of the first N-type MOSFET and the drain of the second N-type MOSFET;

a switch configured to switch between connection and disconnection of an output terminal of the comparator and ground;

a voltage detector configured to detect an output voltage of the amplifying circuit; and a controller, wherein the controller is configured to close the switch when the voltage detector detects a first voltage with respect to 0 volts.

11. The printing device according to claim 10, wherein the negative feedback wiring is connected to the source of the first N-type MOSFET and the drain of the second N-type MOSFET via a low-pass filter.

12. The printing device according to claim 10, wherein a signal indicating a target voltage to be output from the amplifying circuit is input to the controller, and wherein the controller is configured to input a voltage of lower than 0 volts to a positive terminal of the comparator when the target voltage is 0 volts.

13. The printing device according to claim 10, wherein the controller is configured to input a voltage of lower than 0 volts to a positive terminal of the comparator when the voltage detector detects a first voltage with respect to 0 volts.

14. The printing device according to claim 10, wherein the power supply is configured to change a supply voltage, wherein a signal indicating a target voltage to be output from the amplifying circuit is input to the controller, and wherein the controller is configured to change the supply voltage of the power supply to the target voltage lower than a product of a voltage input to a positive terminal of the comparator and an amplification factor of the amplifying circuit when the target voltage is a voltage of higher than 0 volts.

15. The printing device according to claim 10, wherein the power supply is configured to change a supply voltage, wherein the controller is configured to change the supply voltage of the power supply to the target voltage lower than a product of a voltage input to a positive terminal of the comparator and an amplification factor of the amplifying circuit when the voltage detector detects a second voltage with respect to a voltage other than 0 volts.

16. A printing device comprising:

an amplifying circuit configured to amplify a drive waveform signal; and an energy generating element configured to be driven by the drive waveform signal amplified by the amplifying circuit, the energy generating element being configured to eject liquid from a nozzle, wherein the amplifying circuit includes:

a comparator, the drive waveform signal being input to a positive input terminal of the comparator;

a gate driver, an output signal being input to the gate driver from the comparator;

a first N-type MOSFET configured to be driven by the gate driver; and a second N-type MOSFET configured to be driven by the gate driver, wherein a drain of the first N-type MOSFET is connected to a power supply, wherein a source of the first N-type MOSFET is connected to a drain of the second N-type MOSFET, and wherein the printing device further comprises:

negative feedback wiring configured to connect a negative input terminal of the comparator to the source of the first N-type MOSFET and the drain of the second N-type MOSFET;

a voltage detector configured to detect an output voltage of the amplifying circuit; and a controller, wherein the gate driver configured to switch between an effective state and an ineffective state, the effective state being a state where the gate driver outputs a signal according to an output from the comparator, the ineffective state being a state where the gate driver does not output a signal according to an output from the comparator, and wherein the controller is configured to set the gate driver to the ineffective state when the voltage detector detects a second voltage with respect to 0 volts.

17. The printing device according to claim 16, wherein the negative feedback wiring is connected to the source of the first N-type MOSFET and the drain of the second N-type MOSFET via a low-pass filter.

18. The printing device according to claim 16, wherein a signal indicating a target voltage to be output from the amplifying circuit is input to the controller, and wherein the controller is configured to input a voltage of lower than 0 volts to a positive terminal of the comparator when the target voltage is 0 volts.

19. The printing device according to claim 16, wherein the controller is configured to input a voltage of lower than 0 volts to a positive terminal of the comparator when the voltage detector detects a first voltage with respect to 0 volts.

20. The printing device according to claim 16, wherein the power supply is configured to change a supply voltage, wherein a signal indicating a target voltage to be output from the amplifying circuit is input to the controller, and wherein the controller is configured to change the supply voltage of the power supply to the target voltage lower than a product of a voltage input to a positive terminal of the comparator and an amplification factor of the amplifying circuit when the target voltage is a voltage of higher than 0 volts.

* * * * *